US009372887B2

(12) United States Patent
Doji et al.

(10) Patent No.: US 9,372,887 B2
(45) Date of Patent: Jun. 21, 2016

(54) COMPRESSION RATIO IMPROVEMENT BY LAZY MATCH EVALUATION ON THE STRING SEARCH CAM

(75) Inventors: Hiroshi Doji, Tokyo (JP); Nishino Kiyoshi, Tokyo (JP); Nobuyoshi Tanaka, Tokyo (JP)

(73) Assignee: International Business Machines Corporation, Armonk, NY (US)

( * ) Notice: Subject to any disclaimer, the term of this patent is extended or adjusted under 35 U.S.C. 154(b) by 215 days.

(21) Appl. No.: 13/977,005

(22) PCT Filed: Nov. 1, 2011

(86) PCT No.: PCT/JP2011/075170
§ 371 (c)(1),
(2), (4) Date: Jun. 27, 2013

(87) PCT Pub. No.: WO2012/090584
PCT Pub. Date: Jul. 5, 2012

(65) Prior Publication Data
US 2013/0297649 A1 Nov. 7, 2013

(30) Foreign Application Priority Data
Dec. 28, 2010 (JP) .................................. 2010-293990

(51) Int. Cl.
*G06F 17/30* (2006.01)
*G06Q 30/02* (2012.01)
(Continued)

(52) U.S. Cl.
CPC .... *G06F 17/30424* (2013.01); *G06F 17/30286* (2013.01); *G06F 17/30595* (2013.01);
(Continued)

(58) Field of Classification Search
CPC .............. G11C 15/00; G06F 17/30864; G06F 17/30867; G06F 17/30286; G06F 17/30595; G06Q 30/02
USPC .......................................... 707/758, 760, 769
See application file for complete search history.

(56) References Cited

U.S. PATENT DOCUMENTS

| 5,146,599 A * | 9/1992 | Kojima ............... G06F 15/8061 |
| | | 707/E17.011 |
| 5,448,733 A | 9/1995 | Satoh |

(Continued)

FOREIGN PATENT DOCUMENTS

| CN | 1200604 | 12/1998 |
| CN | 1263306 | 8/2000 |

(Continued)

OTHER PUBLICATIONS

"International Application No. PCT/JP20111072891 Search Report", May 7, 2012, 2 pages.

(Continued)

*Primary Examiner* — Pierre Vital
*Assistant Examiner* — Andrew N Ho
(74) *Attorney, Agent, or Firm* — DeLizio Law, PLLC

(57) ABSTRACT

A plurality of stored data sequences that match one or more search data sequences are determined. Each of the stored data sequences of the plurality of stored data sequences comprise a plurality of data elements and the stored data sequences are stored in a content addressable memory array. A longest stored data sequence of the plurality of stored data sequences is determined using a plurality of tracing circuits. An address associated with the longest stored data sequence of the plurality of stored data sequences is determined. A count of data elements of the longest stored data sequence of the plurality of stored data sequences is determined.

8 Claims, 13 Drawing Sheets

(51) Int. Cl.
  *G11C 15/00* (2006.01)
  *H03M 7/30* (2006.01)
  *G11C 15/04* (2006.01)

(52) U.S. Cl.
  CPC .... *G06F17/30864* (2013.01); *G06F 17/30867* (2013.01); *G06Q 30/02* (2013.01); *G11C 15/00* (2013.01); *G11C 15/04* (2013.01); *H03M 7/3086* (2013.01)

(56) References Cited

U.S. PATENT DOCUMENTS

| | | | | |
|---|---|---|---|---|
| 5,455,576 | A | * | 10/1995 | Clark et al. ............ 341/50 |
| 5,877,714 | A | | 3/1999 | Satoh |
| 5,883,588 | A | | 3/1999 | Okamura |
| 6,615,310 | B1 | * | 9/2003 | Ridings ............ 711/108 |
| 6,667,699 | B2 | | 12/2003 | Jones et al. |
| 6,799,246 | B1 | * | 9/2004 | Wise et al. ............ 711/117 |
| 7,050,317 | B1 | * | 5/2006 | Lien et al. ............ 365/49.1 |
| 7,643,324 | B2 | * | 1/2010 | Roth ............ 365/49.1 |
| 7,783,654 | B1 | * | 8/2010 | Sreenath ............ 707/758 |
| 7,937,510 | B1 | * | 5/2011 | Langhammer ............ 710/62 |
| 2011/0029556 | A1 | * | 2/2011 | Pandya ............ 707/769 |
| 2013/0283135 | A1 | | 10/2013 | Kiyoshi et al. |

FOREIGN PATENT DOCUMENTS

| | | |
|---|---|---|
| CN | 1388443 | 1/2003 |
| JP | 63177242 | 7/1988 |
| JP | 05252047 | 9/1993 |
| JP | 07114577 | 5/1995 |
| JP | 08147986 | 6/1996 |
| JP | 08242176 | 9/1996 |
| JP | 2005175940 | 6/2005 |
| JP | 2010268146 | 11/2010 |
| WO | 2004012338 | 2/2004 |
| WO | 2010050282 | 5/2010 |

OTHER PUBLICATIONS

"International Application No. PCT/JP2011/075170 Search Report", May 7, 2012 , 2 pages.

Miyatake, Hisatada , "High-Speed Parallel Content-Addressable Memory (CAM) Having Parity Check Function during Search", ProVISION No. 67; English Abstract Nov. 2010 , p. 87.

Pagiamtzis, Kostas et al., "A Soft-Error Tolerant Content-Addressable Memory (CAM) Using an Error-Correcting-Match Scheme", IEEE 2006 Custom Intergrated Circuits Conference (CICC) 2006 , pp. 301-304.

Rabaey, Jan M. et al., "Design Project: 512-Word Content-Addressable Memory", Digital Integrated Circuits—A Design Perspective 2/e, Chapters 6 and 12 Prentice Hall 2003 , 5 pages.

Yang, Ren-Yang et al., "High-Throughput Data Compressor Designs Using Content Addressable Memory", 1995 , pp. 147-150.

CN Application No. 201180061806.6 Office Action, Jul. 31, 2015, 5 pages.

* cited by examiner (a)

(b)

(c)

(a)

(b)

(e)

(f)

COMPRESSION RATIO IMPROVEMENT BY LAZY MATCH EVALUATION ON THE STRING SEARCH CAM

TECHNICAL FIELD

The present inventive subject matter relates to computing systems. In particular, it relates to using computing hardware to improve a compression ratio.

BACKGROUND

The deflate compression (RFC1951) is a compression algorithm on which ZLIB (RFC1950) and GZIP (RFC1952) widely used in computers are based. The deflate compression is a combination of two kinds of compression algorithms, and LZ77 encoding is used in the first half of the deflate compression. The LZ77 encoding is to compress data by searching for an iterative character sequence part of the data and replacing the iterative character sequence part with the position and length of the iterative character sequence part. For example, in LZ77 encoding of a character sequence "IBM is IBM", the "IBM" that occurs the second time is an iterative character sequence part and therefore is compressed. More specifically, the iterative character sequence part is replaced with a code, such as "7, 3" indicating that a character sequence having a length of three characters starting with the seventh character prior to the leading character of the iterative character sequence part, and thus is compressed. In this case, the greater the length of the iterative part, the higher the compression ratio is.

According to the specifications of the deflate compression, up to 32 kilobytes of preceding data is searched for an iterative character sequence part, and the search for an iterative character sequence part uses a large amount of character sequence comparison processing.

If the processing is performed by software, the processing can take a long time. Typically, software uses the hash method to reduce the search time. However, if there are many character sequences having the same hash value, the hash method may discard some of the character sequences. Thus, it is difficult to completely search the whole of a character.

SUMMARY

The present inventive subject matter provides an apparatus that determines a search start point in a first data element sequence in searching a second data element sequence based on the first data element sequence, comprising: a content addressable memory that stores each data element of a plurality of data elements forming the second data element sequence at an address corresponding to a position of the data element in the second data element sequence, and outputs, when a search data element is given, the address at which a match data element that matches with the search data element is stored if the match data element is stored as one of the plurality of data elements; a plurality of generating circuits each of which is a generating circuit that generates row presence information based on the address output from the content addressable memory if the search data element is given to the content addressable memory and a sequence of matching data elements that matches with a sequence starting at a specific start point determined for the generating circuit in a sequence of previously given search data elements is stored in the content addressable memory, the row presence information indicating that the sequence of matching data elements is stored; and a determining part that determines the search start point based on a plurality of pieces of row presence information successively generated by the plurality of generating circuits when the data elements forming the first data element sequence are successively given to the content addressable memory as the search data element.

If the number of successive generations of the row presence information by a particular generating circuit of the plurality of generating circuits satisfies a predetermined condition for the number to be recognized to be large enough, the determining part may determine the specific start point determined for the particular generating circuit as the search start point.

The predetermined condition may include a condition that the number of successive generations of the row presence information by the particular generating circuit is greater than the number of successive generations of the row presence information by any other generating circuit of the plurality of generating circuits.

Furthermore, the present inventive subject matter provides an apparatus that compresses a data element sequence by replacing a first partial data element sequence of the data element sequence with information on a position and a length of a second partial data element sequence of the data element sequence, comprising: a content addressable memory that stores each data element of a plurality of data elements forming at least a part of the data element sequence at an address corresponding to a position of the data element in the data element sequence, and outputs, when a search data element is given, the address at which a match data element that matches with the search data element is stored if the match data element is stored as one of the plurality of data elements; a plurality of generating circuits each of which is a generating circuit that generates row presence information and row address information based on the address output from the content addressable memory if the search data element is given to the content addressable memory and a sequence of matching data elements that matches with a sequence starting at a specific start point determined for the generating circuit in a sequence of previously given search data elements is stored in the content addressable memory, the row presence information indicating that the sequence of matching data elements is stored, and the row address information indicating the address at which the sequence of matching data elements is stored; and a determining part that determines a position and a length of the second partial data element sequence based on a plurality of pieces of row presence information and a plurality of pieces of row address information successively generated by the plurality of generating circuits by successively giving the data elements forming the first partial data element sequence to the content addressable memory as the search data element.

Furthermore, the present inventive subject matter provides an apparatus that compresses a data element sequence by replacing a first partial data element sequence of the data element sequence with information on a position and a length of a second partial data element sequence of the data element sequence, comprising: a content addressable memory that stores each data element of a plurality of data elements forming at least a part of the data element sequence at an address corresponding to a position of the data element in the data element sequence, and outputs, when a search data element is given, the address at which a match data element that matches with the search data element is stored if the match data element is stored as one of the plurality of data elements; a primary generating circuit that generates first row presence information and first row address information based on the address output from the content addressable memory if the search data element is given to the content addressable memory and a sequence of matching data elements that matches with a sequence starting at a reference data element in a sequence of previously given search data elements is stored in the content addressable memory, the first row presence information indicating that the sequence of matching data elements is stored, and the first row address information indicating the address at which the sequence of matching data elements is stored; K expansion generating circuits a J-th expansion generating circuit of which generates first row presence information and first row address information based on the address output from the content addressable memory if the search data element is given to the content addressable memory and a sequence of matching data elements that matches with a sequence starting at a J-th data element from the reference data element in a sequence of previously given search data elements is stored in the content addressable memory, the first row presence information indicating that the sequence of matching data elements is stored, and the first row address information indicating the address at which the sequence of matching data elements is stored (K represents a natural number, and J represents a natural number equal to or smaller than K); a first outputting circuit that outputs second row presence information if the search data element is given to the content addressable memory and the first row presence information is generated by any of the primary generating circuit and the K expansion generating circuits, the second row presence information indicating that a sequence of matching data elements that matches with a sequence starting at any data element subsequent to the reference data element in a sequence of previously given search data elements is stored in the content addressable memory; a second outputting circuit that outputs, as second row address information, the first row address information generated by at least one generating circuit that generates the first row presence information of the primary generating circuit and the K expansion generating circuits if the search data element is given to the content addressable memory; and a determining part that successively gives the data elements forming the first partial data element sequence to the content addressable memory as the search data element, determines the position of the second partial data element sequence based on the second row address information output from the second outputting circuit immediately before the first outputting circuit no longer outputs the second row presence information, and determines the length of the second partial data element sequence based on the number of successive outputs of the second row presence information from the first outputting circuit.

Furthermore, the present inventive subject matter provides a method of determining a search start point in a first data element sequence in searching a second data element sequence based on the first data element sequence, comprising: a content addressable memory that stores each data element of a plurality of data elements forming the second data element sequence at an address corresponding to a position of the data element in the second data element sequence, and outputs, when a search data element is given, the address at which a match data element that matches with the search data element is stored if the match data element is stored as one of the plurality of data elements; a step of each generating circuit of a plurality of generating circuits generating row presence information based on the address output from the content addressable memory if the search data element is given to the content addressable memory and a sequence of matching data elements that matches with a sequence starting at a specific start point determined for the generating circuit in a sequence of previously given search data elements is stored in the content addressable memory, the row presence information indicating that the sequence of matching data elements is stored; and a step of determining the search start point based on a plurality of pieces of row presence information successively generated by the plurality of generating circuits by successively giving the data elements forming the first data element sequence to the content addressable memory as the search data element.

BRIEF DESCRIPTION OF THE DRAWINGS

FIG. 7-1 is a diagram showing an example of a configuration of an iterative data searching apparatus according to the embodiment of the present inventive subject matter;

FIG. 7-2 is a diagram showing the example of the configuration of the iterative data searching apparatus according to the embodiment of the present inventive subject matter;

FIGS. 8-1(*a*) and 8-1(*b*) are conceptual diagrams for illustrating operations in the iterative data searching circuit and a tracing circuit according to the embodiment of the present inventive subject matter;

FIGS. 8-2(*c*) and 8-2(*d*) are conceptual diagrams for illustrating operations in the iterative data searching circuit and the tracing circuit according to the embodiment of the present inventive subject matter;

FIGS. 8-3(*e*) and 8-3(*f*) are conceptual diagrams for illustrating operations in the iterative data searching circuit and the tracing circuit according to the embodiment of the present inventive subject matter;

DESCRIPTION OF EMBODIMENT(S)

In the following, an embodiment of the present inventive subject matter will be described in detail with reference to the accompanying drawings.

Figure 1:
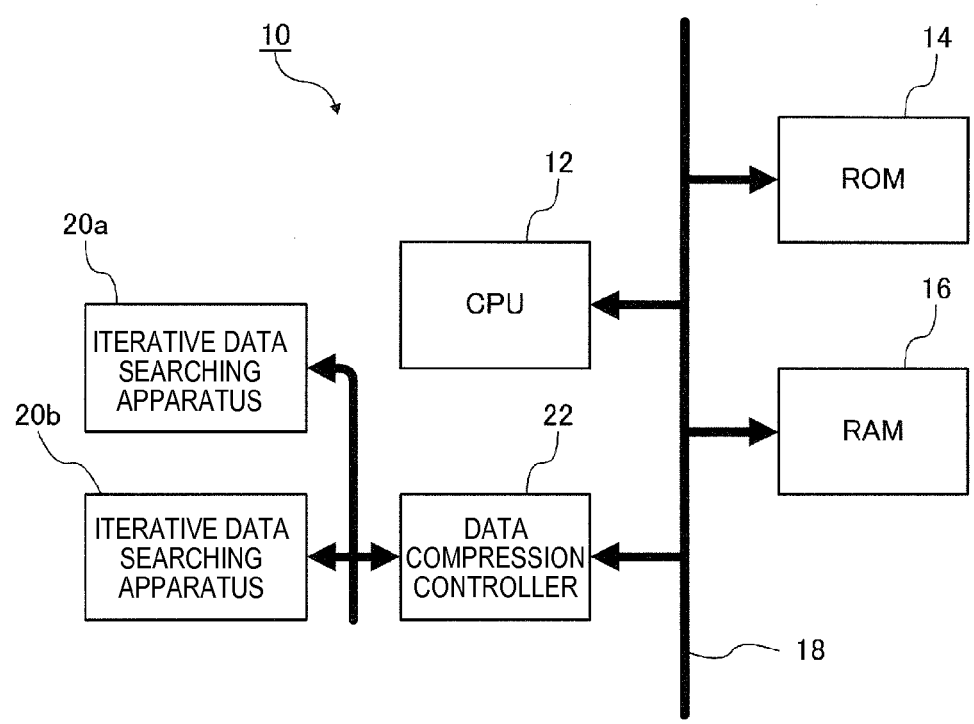
FIG. 1 is a diagram showing an example of a configuration of a microcomputer to which an embodiment of the present inventive subject matter is applied.

FIG. 1 shows a configuration of a part of a microcomputer 10 to which this embodiment is applied. The microcomputer 10 includes a CPU 12, a ROM 14 and a RAM 16, which are connected to each other by a bus 18, which includes an address bus, a data bus, a control bus and the like.

The microcomputer 10 further includes a plurality of iterative data searching apparatuses 20*a*, 20*b* and so on according to this embodiment, which are connected to the bus 18 via a data compression controller 22 that controls the operation of the iterative data searching apparatuses. The iterative data searching apparatuses 20*a*, 20*b* and so on have the same configuration, and P+1 iterative data searching apparatuses are provided in this embodiment. In the following, the P+1 iterative data searching apparatuses will be collectively referred to as an "iterative data searching apparatus 20", and a configuration of the iterative data searching apparatus 20 will be described. Each individual iterative data searching apparatus will be referred to as a block, such as a "block 0" and a "block P", to distinguish it from the other iterative data searching apparatuses.

Figure 2:
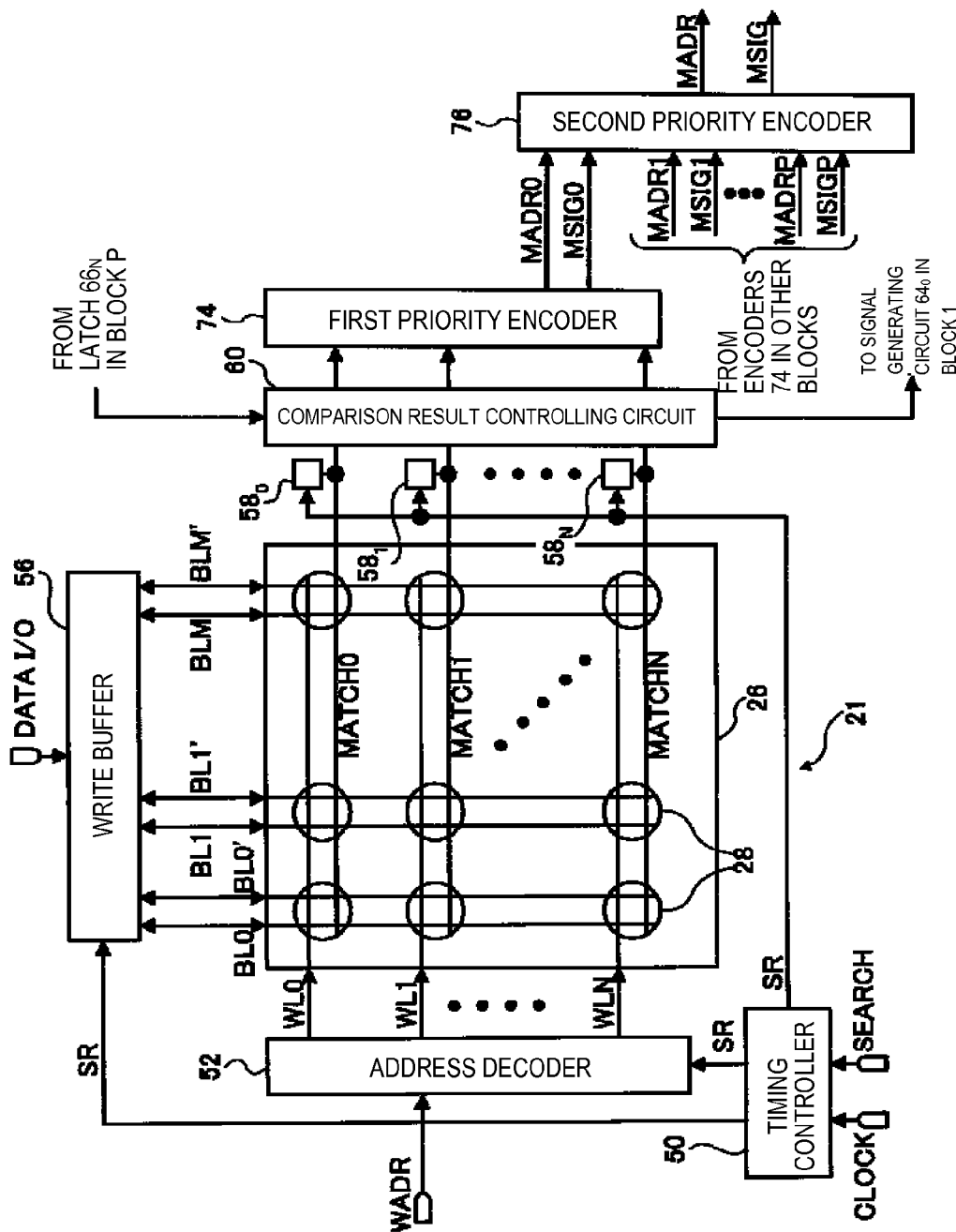
FIG. 2 is a block diagram showing an example of a configuration of an iterative data searching circuit according to the embodiment of the present inventive subject matter.

FIG. 2 is a diagram showing an iterative data searching circuit 21 on which the iterative data searching apparatus 20 according to this embodiment is based.

The iterative data searching circuit 21 has a CAM cell array 26 comprising a large number of content addressable memory cells 28 arranged in a matrix (the content addressable memory will be abbreviated as CAM hereinafter). In the drawing, the CAM cells 28 are shown by circles. In the CAM cell array 26, N+1 word lines WL0 to WLN, N+1 match lines MATCH0 to MATCHN and M+1 bit line pairs BL0 and BL0' to BLM and BLM' are each arranged in a matrix, and each CAM cell 28 is connected to any of the word lines WL0 to WLN, any of the match lines MATCH0 to MATCHN and any of the bit line pairs BL0 and BL0' to BLM and BLM'.

Figure 3:
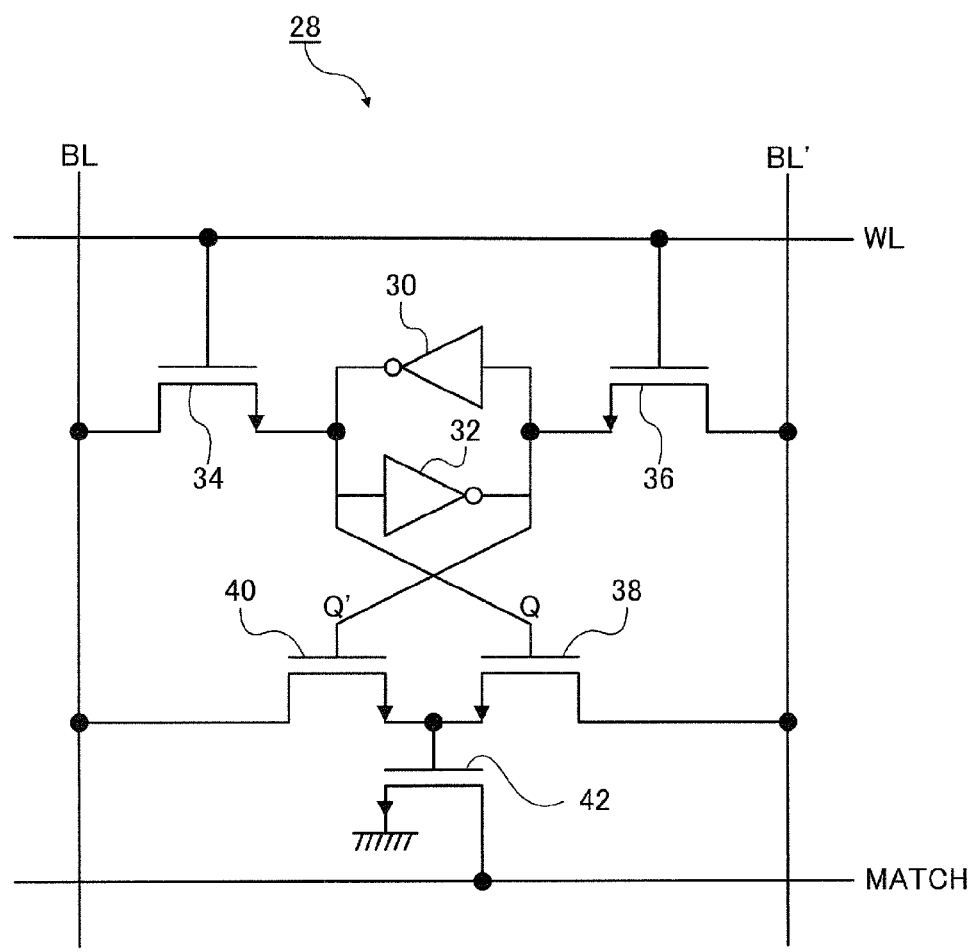
FIG. 3 is a circuit diagram showing an example of a configuration of a content addressable memory.

As shown in FIG. 3, the CAM cell 28 has two NOT circuits 30 and 32 with an input terminal and an output terminal of one circuit connected to an output terminal and an input terminal of the other circuit, respectively. The loop formed by the NOT circuits 30 and 32 forms a storage circuit (of SRAM type) that stores 1-bit data. The output terminal of the NOT circuit 30 is connected to the source of an N-MOSFET 34, the output terminal of the NOT circuit 32 is connected to the source of an N-MOSFET 36, and the gates of the N-MOSFETs 34 and 36 are connected to the word line WL. The drains of the N-MOSFETs 34 and 36 are connected to the bit lines BL and BL', respectively.

To write 1-bit data to the CAM cell 28, the word line WL is set at HIGH level, the bit line BL is set at a level corresponding to data D to be written (HIGH level if the data D is "1", and LOW level if the data is "0"), and the bit line BL' is set at a level inverted from the level of the bit line BL (LOW level if the bit line BL is at HIGH level, and HIGH level if the bit line BL is at LOW level). This causes the N-MOSFETs 34 and 36 to turn on, and thus, the data supplied via the bit lines BL and BL' is held in the loop of the NOT circuits 30 and 32.

The output terminal of the NOT circuit 30 is connected to the gate of the N-MOSFET 38, and the output terminal of the NOT circuit 32 is connected to the gate of the N-MOSFET 40. The NOT circuit 32 outputs data (Q') inverted from the data D, and the NOT circuit 30 outputs data Q (=D) inverted from the data Q'. The drains of the N-MOSFETs 38 and 40 are connected to the bit lines BL' and BL, respectively, and the sources of the N-MOSFETs 38 and 40 are connected to the gate of an N-MOSFET 42. The drain of the N-MOSFET 42 is connected to the match line MATCH, and the source of the N-MOSFET 42 is grounded.

In this embodiment, as an example, M+1 CAM cells 28 are connected to the same word line and the same match line, so that M+1-bits of data can be stored in the plurality of CAM cells 28 connected to the same word line and the same match line (these CAM cells will be referred to as a CAM cell row hereinafter). In the CAM cell array 26, an address is allocated to each CAM cell row.

Referring to FIG. 2 again, the iterative data searching circuit 21 has a timing controller 50. The timing controller 50 is connected to the data compression controller 22. When a search instruction SEARCH is input from the data compression controller 22 to the timing controller 50, the iterative data searching circuit 21 performs a "search," which involves repeatedly comparing input search data with data stored in each CAM cell row of the CAM cell array 26 and writing the search data to any of the CAM cell rows of the CAM cell array 26.

A system clock CLOCK is input from the data compression controller 22 to the timing controller 50, and the timing controller 50 generates and outputs a clock SR synchronized with the system clock CLOCK. The clock SR is also output to a write buffer 56 connected to the timing controller 50.

The write buffer 56 is connected to the data compression controller 22, and search data is successively input to the write buffer 56 from the controller 22. The write buffer 56 is connected to the bit line pairs BL0 and BL0' to BLM and BLM', holds the input search data, and changes the level of the bit line pairs BL0 and BL0' to BLM and BLM' (that is, drives the bit line pairs) according to the value of the held search data at a at a timing synchronized with the clock SR input from the timing controller 50. While the write buffer 56 is driving the bit line pairs according to predetermined search data, the predetermined search data is compared with the data stored in each CAM cell row and written to a predetermined CAM cell row.

The timing controller 50 is also connected to an address decoder 52, and the clock SR is also output to the address decoder 52. The address decoder 52 is connected to the data compression controller 22, and the data compression controller 22 designates the address of the CAM cell row to which the search data is to be written (a write address WADR). The word lines WL0 to WLN are connected to the address decoder 52, and the address decoder 52 asserts (enables) the word line of the CAM cell row corresponding to the designated write address WADR and writes the predetermined search data to the CAM cell row corresponding to the designated address at a timing synchronized with the clock SR. More specifically, the predetermined search data is written to the CAM cell row corresponding to the designated address after comparison of the predetermined search data with the data stored in each CAM cell row during a period in which the write buffer 56 is driving the bit line pairs according to the predetermined search data.

N+1 match line controllers $58_0$ to $58_N$, each of which is connected to the corresponding one of the match lines MATCH0 to MATCHN, is also connected to the timing controller 50, and the clock SR is also output to the match line controllers $58_0$ to $58_N$. Based on the input clock SR, the match line controllers $58_0$ to $58_N$ charge (precharge) the match lines MATCH0 to MATCHN to HIGH level before the search data is compared with the data stored in each CAM cell row. The precharging of the match lines by the match line controllers $58_0$ to $58_N$ occurs in a period after driving of the bit line pairs according to the predetermined search data by the write buffer 56 is completed and before driving of the bit line pairs according to the next search data is started.

Figure 4:
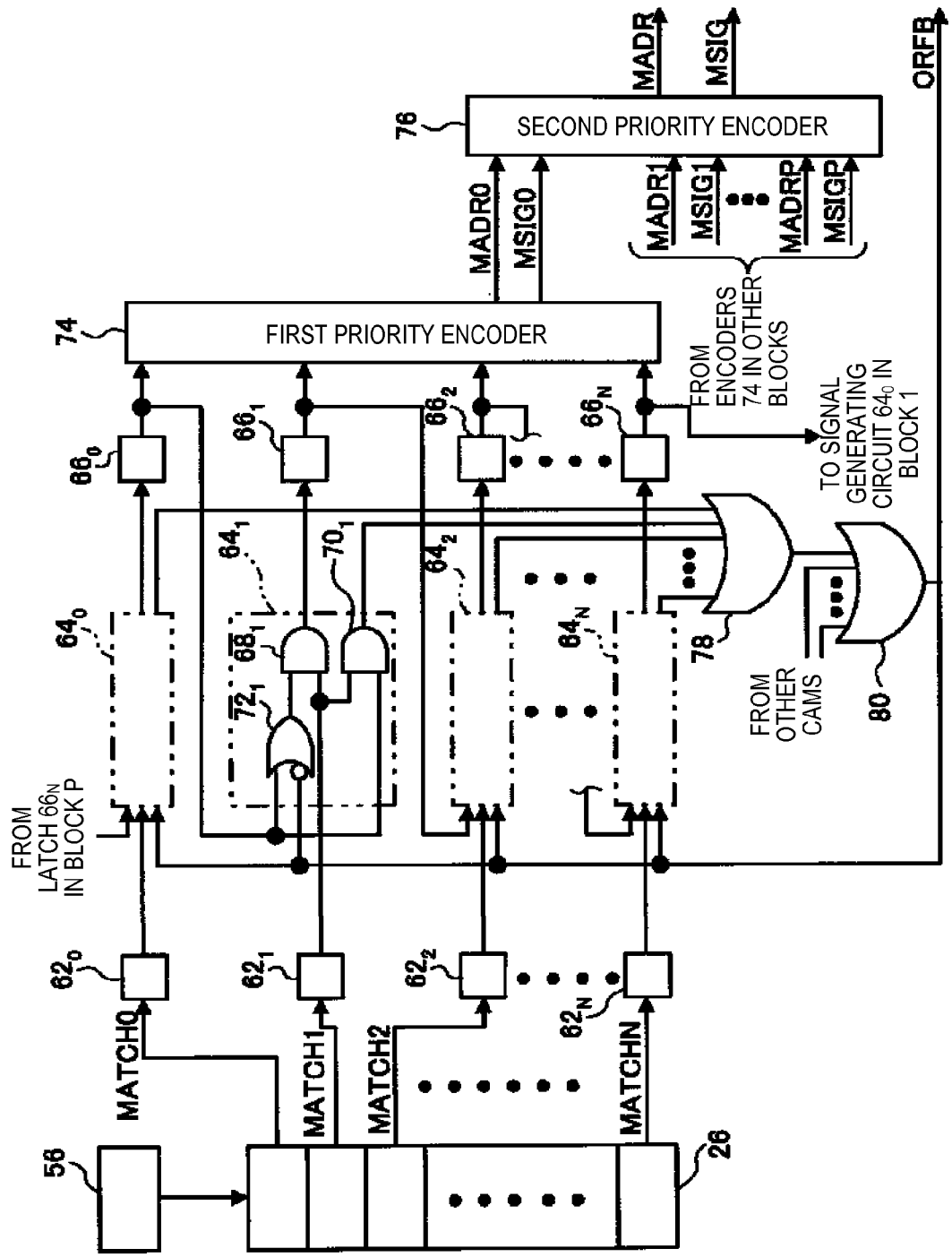
FIG. 4 is a block diagram showing an example of a configuration of a comparison result controlling circuit according to the embodiment of the present inventive subject matter.

The match lines MATCH0 to MATCHN are also connected to a comparison result controlling circuit 60. As shown in FIG. 4, the comparison result controlling circuit 60 has latches $62_0$ to $62_N$, signal generating circuits $64_0$ to $64_N$ and latches $66_0$ to latches $66_0$ to $66_N$. In FIG. 4, illustration of the match line controllers $58_0$ to $58_N$ is omitted. Of the signal generating circuits $64_0$ to $64_N$, although FIG. 4 shows only a specific configuration of the signal generating circuit $64_1$ connected to the match line MATCH1, the other signal generating circuits may have the same configuration. In the following, only a circuit part of the comparison result controlling circuit 60 involved with the match line MATCH1 will be described.

The match line MATCH1 is connected to an input terminal of the latch $62_1$, and an output terminal of the latch $62_1$ is connected to one of two input terminals of each of AND circuits $68_1$ and $70_1$ in the signal generating circuit $64_1$. To the other of the two input terminals of the AND circuit $68_1$, an output terminal of an OR circuit $72_1$ is connected. One of two input terminals of the OR circuit $72_1$ and the other of the two input terminals of the AND circuit $70_1$ are connected to an output terminal of the latch $66_0$ in the preceding stage. An output terminal of the AND circuit $68_1$ is connected to an input terminal of the latch $66_1$, and an output terminal of the latch $66_1$ is connected to an input terminal of each of an OR circuit $72_2$ and an AND circuit $70_2$ (neither shown) in the signal generating circuit $64_2$ in the following stage, as with the output terminal of the latch $66_0$ described above. The output terminal of the latch $66_1$ is also connected to an input terminal of a first priority encoder 74. An output terminal of the AND circuit $70_1$ is connected to one of input terminals of an OR circuit 78. To the other input terminals of the OR circuit 78, output terminals of AND circuits $70_0$ and $70_2$ to $70_N$ (not shown) are connected. An output terminal of the OR circuit 78 is connected to one of input terminals of an OR circuit 80. To the other input terminals of the OR circuit 80, output terminals of the OR circuits 78 in the other iterative data searching circuits 21 are connected. An output terminal of the OR circuit 80 is connected to input terminals of OR circuits $72_0$ to $72_N$ in the signal generating circuits $64_0$ to $64_N$ via an inverter, not shown (only the OR circuit $72_1$ is shown in the drawing). A feedback signal ORFB output from the OR circuit 80 is inverted and then input to the OR circuits $72_0$ to $72_N$. The feedback signal ORFB output from the OR circuit 80 is also output to the data compression controller 22 (see FIG. 2).

FIG. 4 shows the comparison result controlling circuit 60 in the iterative data searching circuit 21 in the block 0, and one of the two input terminals of the OR circuit $72_0$ in the signal generating circuit $64_0$ is connected to the output terminal of the latch $66_N$ in the comparison result controlling circuit 60 in the block P. The output terminal of the latch $66_N$ in the comparison result controlling circuit 60 in the block 0 is connected to one of the two input terminals of the OR circuit $72_0$ in the comparison result controlling circuit 60 in the block 1 (see FIG. 2).

An output terminal of the first priority encoder 74 is connected to an input terminal of the second priority encoder 76. The first priority encoder 74 encodes an address corresponding to a signal at HIGH level after a "search" operation of the signals input from the latches $66_0$ to $66_N$ in the comparison result controlling circuit 60 and outputs the encoded address as a match address MADR0 to the second priority encoder 76, and outputs a logical sum of the signals input from the latches $66_0$ to $66_N$ as a match signal MSIG0 to the second priority encoder 76. If a plurality of signals of the signals input from the latches $66_0$ to $66_N$ are at HIGH level, an address of the content addressable memory cell row of the highest priority according to a predetermined criterion, for example, the lowest address or the address closest to the write address WADR at that point in time, is output as the match address MADR0. The reason why the latter address is output is because distance information used in compression has a small volume and therefore leads to a high compressibility.

To the input terminal of the second priority encoder 76, the match addresses MADR and the match signals MSIG output from the first priority encoders 74 in the other iterative data searching circuits 21 are also input. An output terminal of the second priority encoder 76 is connected to the data compression controller 22.

The second priority encoder 76 has substantially the same configuration as the first priority encoder 74. The second priority encoder 76 outputs an address of the highest priority according to a predetermined criterion among the addresses for which the match signals MSIG0 to MSIGP are at HIGH level among the addresses MADR0 to MADRP input from the plurality of first priority encoders 74, for example, an address formed by adding the address of the relevant block (the address allocated to the relevant one of the plurality of iterative data searching apparatuses) to the lowest address or the address closest to the write address WADR at that point in time, as the match address MADR to the data compression controller 22, and outputs a signal indicating a logical sum of the match signals MSIG0 to MSIGP input from the plurality of first priority encoders 74 as the match signal MSIG to the data compression controller 22.

Next, as an effect of this embodiment, a comparison operation that occurs in the iterative data searching circuit 21 will be described. To compress data to be compressed (original data), the data compression controller 22 successively extracts unit data having a predetermined bit length from the original data as search data and successively outputs the search data to the iterative data searching circuit 21 along with the search instruction SEARCH and the write address WADR, as described later.

In the iterative data searching circuit 21 having received the search instruction SEARCH, the timing controller 50 outputs the clock SR to the write buffer 56, the address decoder 52 and the match line controllers $58_0$ to $58_N$, the match line controller 58 precharges the match lines MATCH0 to MATCHN before the comparison operation by the CAM cell array 26, and the write buffer 56 holds the input search data and drives the bit line pairs BL0 and BL0' to BLM and BLM' according to the search data.

In each CAM cell 28 in the CAM cell array 26, the N-MOSFET 38 is turned on if the data Q output from the NOT circuit 30 is "1" (HIGH level), and the N-MOSFET 40 is turned on if the data Q' output from the NOT circuit 32 is "1". Therefore, if the data Q (Q') held in the loop of the NOT circuits 30 and 32 matches with the data D (D') supplied through the bit line pairs BL and BL', the N-MOSFET 42 is not turned on. And if the data Q (Q') does not match with the data D (D'), a current flows from the drain to the source of either of the N-MOSFETs 38 and 40 that is turned on, and the N-MOSFET 42 is turned on. As a result, the level of the precharged match line MATCH is reduced to LOW level (discharge).

The data comparison described above simultaneously occurs in the CAM cells 28. A plurality of CAM cells 28 (a CAM cell row) is connected to one match line MATCH, and the comparison operation between the input character data and the character data stored in the CAM cell row is generally completed in the first half of one period of the clock SR. Each match line is maintained at HIGH level only if the N-MOSFET 42 is not turned on in all the CAM cell 28 connected thereto, that is, if the character data stored in the CAM cell row matches with the character data input to the write buffer 56, and is set at LOW level if the character data do not match with each other.

In the second half of one period of the clock SR, the address decoder 52 asserts (enables) the word line of the CAM cell row corresponding to the input write address WADR, and the search data is written to the CAM cell row. Then, when writing of the search data to the CAM cell row is completed, the word line is set at LOW level, and driving of each bit line pair by the write buffer 56 is stopped, the match line controller 58 precharges each match line again.

The operation (comparison operation) described above occurs in one period of the clock SR and is repeated in synchronization with input of the search data, the search instruction SEARCH and the write address WADR from the data compression controller 22.

The character data in the above description is an example of data element. The feedback signal ORFB set at "1" is an example of row presence information that indicates that a row of matching data elements is stored, that is, first row presence information. The match address MADR is an example of row address information that indicates the address at which the row of matching data elements is stored, that is, first row address information. The part formed by the signal generating circuit 64, the latch 66, the first priority encoder 74, the second priority encoder 76 and the OR circuit 78 is an example of a generating circuit, in particular, a primary generating circuit. Furthermore, the data compression controller 22 is an example of a determining part that determines the search start point and the position and length of the data element row.

Figure 5:
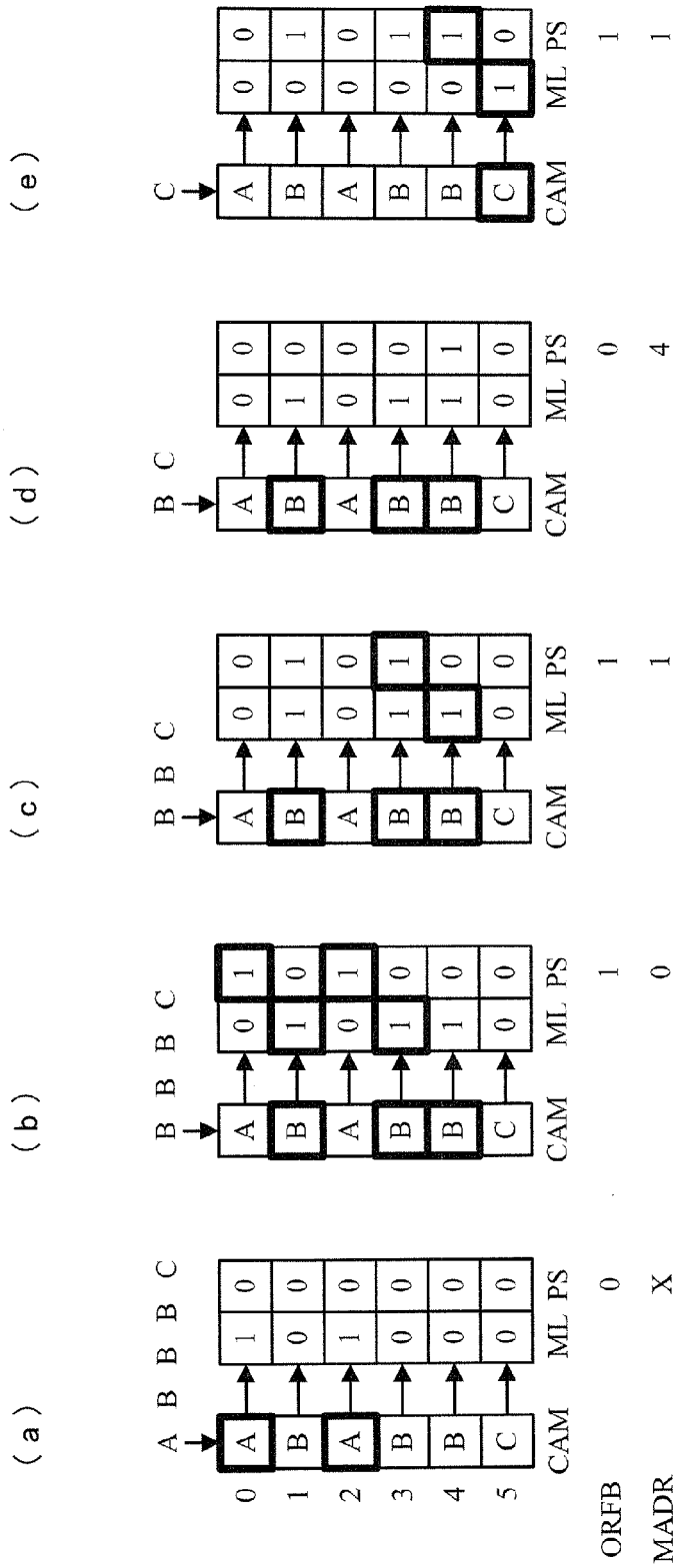
FIGS. 5(*a*) to 5(*e*) are conceptual diagrams for illustrating an operation of the comparison result controlling circuit according to the embodiment.

Next, an operation of the comparison result controlling circuit 60 will be described with reference to FIG. 5. As an example, FIG. 5 shows a case where the original data is text data, a character data sequence "ABABBC" is previously stored in CAM cell rows of addresses "0" to "5", and character data A, B, B, B, C and so on are input in this order as the search data. The latches $62_0$ to $62_5$ are shown as ML0 to ML5, and the latches $66_0$ to $66_5$ are shown as PS0 to PS5. In the following description, it will be assumed that the result of the comparison operation in the other iterative data searching apparatuses is constantly "not match".

As shown in FIG. 5(a), when character data "A" is first input as the search data, the comparison result is "match" in the CAM cell rows of addresses "0" and "2" (enclosed by the thick frame in FIG. 5). Of the match lines MATCH0 to MATCH5, the match lines other than the match lines MATCH0 and MATCH2 are discharged to LOW level, and only the match lines MATCH0 and MATCH2 are maintained at HIGH level. The levels of the match lines MATCH0 to MATCH5 are held in the latches ML0 to ML5 in the comparison result controlling circuit 60, respectively, and then, in the next period, output to the signal generating circuits $64_0$ to $64_5$, respectively.

As shown in FIG. 5(a), at this point in time, the levels held in the latches PS0 to PS5 are LOW level ("0" in FIG. 5, the same holds true for the latches PS6 to PSN, which are not shown, and the latches PS0 to PSN of the other blocks), and therefore, the signals output from the AND circuits $70_0$ to $70_5$ are all at LOW level, and the feedback signal ORFB0 output from the OR circuit 78 and the feedback signal ORFB output from the OR circuit 80 are also at LOW level. As can be seen from the above description, according to this embodiment, the feedback signal ORFB is not set at HIGH level when only one character matches with the stored data, that is, when only one comparison operation in a CAM cell row yields a comparison result "match". Since the feedback signal ORFB is at LOW level, the outputs of the OR circuits $72_0$ to $72_5$ are all at HIGH level, and the levels of the signals output from the latches ML0 to ML5 are held in the latches PS0 to PS5 without change (see FIG. 5(b)).

As shown in FIG. 5(b), when character data "B" is input as the next search data, the comparison result is "match" in the CAM cell rows of addresses "1", "3" and "4", and the levels of the match lines (only the match lines MATCH1, MATCH3 and MATCH5 are at HIGH level) are held in the latches ML0 to ML5. Then, in the next period, the outputs of the latches ML1, ML3 and ML5 are set at HIGH level, and the outputs of the latches PS0 and PS2 (that is, the latches PS in the respective preceding stages of the latches ML1 and ML3) are set at HIGH level, so that the signals output from the AND circuits $70_1$ and $70_3$ are set at HIGH level, and the feedback signal ORFB0 output from the OR circuit 78 and the feedback signal ORFB output from the OR circuit 80 are set at HIGH level, as shown in FIG. 5(b).

As can be seen from the above description, the feedback signal ORFB is set at high level only if two or more successive characters match with the stored data, that is, if a data sequence comprising a plurality of successively input pieces of search data is already stored in the CAM cell array 26. If it is assumed that the first priority encoder 74 outputs the lowest address as the match address MADR0, the match address MADR0 is an address "0", which corresponds to the latch PS0. Although the match address MADR output from the second priority encoder 76 depends on the value of the match addresses input from the other iterative data searching apparatuses, the values of lower significance bits of the match address MADR are equal to the values of the match address MADR0 if the data does not match with the stored data in the other iterative data searching apparatuses. The values of higher significance bits of the match address MADR are the value of the address of the matching encoder block (the address allocated to the relevant one of the plurality of iterative data searching apparatuses). In this case, since the relevant block is the block of the address "0", the values are all 0.

As shown in FIG. 5(c), when character data "B" is input as the next search data, the same match lines as those in the case of the preceding search data are set at HIGH level, and the levels of the match lines are held in the latches ML0 to ML5 and then output to the signal generating circuits $64_0$ to $64_5$. At this point in time, of the latches ML1, ML3 and ML4 whose outputs are at HIGH level, only the latch ML4 receives an output at HIGH level from the latch PS in the preceding stage, so that of the signals output from the AND circuits $70_1$, $70_3$ and $70_4$, only the signal output from the AND circuit $70_4$ is at HIGH level. Therefore, the feedback signal ORFB0 output from the OR circuit 78 is maintained at HIGH level, and the match address MADR0 is an address "4", which corresponds to the latch PS4.

Since the feedback signal ORFB is maintained at HIGH level, provided the current cycle is denoted by "m", a signal corresponding to a logical product of an output ML(n, m) of a latch ML of an address "n" and an output PS(n−1, m) of a latch PS in the preceding stage is output to a latch PS of an address "n". As a result, only the latch PS4 holds HIGH level.

Then, as shown in FIG. 5(d), character data "B" is input as the next search data. In this case, the levels of the match lines temporarily held in the latches ML0 to ML5 and then input to the signal generating circuits $64_0$ to $64_5$ are the same as those in the case of the preceding search data. However, all the latches ML1, ML3 and ML4 that output signals at HIGH level receive signals at LOW level output from the latches PS in the respective preceding stages, so that the all the signals output from the AND circuits $70_0$ to $70_5$ are at LOW level, and the feedback signal ORFB0 and the feedback signal ORFB are at LOW level. When the feedback signal ORFB is set at LOW level, the output signals of the OR circuits $72_0$ to $72_5$ in the signal generating circuits $64_0$ to $64_5$ are set at HIGH level, so that the levels of the signals output from the latches ML1 to ML5 are held in the latches PS0 to PS5 without change.

Then, as shown in FIG. 5(e), when character data "C" is input as the next search data, only the match line MATCH5 is set at HIGH level, and the levels of the match lines are temporarily held in the latches ML0 to ML5 and then output to the signal generating circuits $64_0$ to $64_5$, respectively. In this case, only the latch ML5 outputs a signal at HIGH level, and the latch PS4 in the preceding stage also outputs a signal at HIGH level. As a result, of the signals output from the AND circuits $70_0$ to $70_5$, only the signal output from the AND circuit $70_5$ is set at HIGH level. Therefore, the feedback signal ORFB0 output from the OR circuit 78 is maintained at HIGH level, and the match address MADR0 is an address "1", which corresponds to the latch PS1.

As described above, the iterative data searching circuit 21 has a function of searching the whole of the CAM cell array 26 for a character that matches with every input character and a function of holding information on whether the sequence of characters preceding any character that matches with a character stored in the CAM cell array 26 matches with a character sequence stored in the CAM cell array 26 and can search for a character sequence at a much higher speed than other methods.

There is a problem of how to start tracing of a character sequence. Typically, tracing of the character sequence starts at the position of the first matching character. According to this method, a character sequence can be efficiently compressed to some extent. Depending on the character sequence to be compressed, however, starting tracing a character sequence at a position of the first matching character may not lead to the best compression.

Figure 6:
FIG. 6 is a diagram showing a specific example of a character sequence search in which a plurality of character sequence tracings needs to be performed in parallel.
Figure 6:
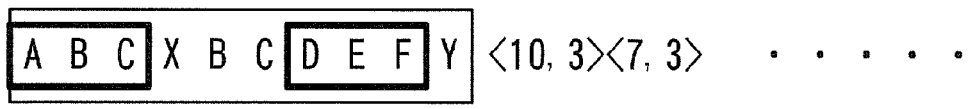
Figure 6:

FIG. 6 shows an example of such a character sequence search.

In this example, as shown in FIG. 6(*a*), in a state where ten characters starting with "A" and ending with "Y" (enclosed by a frame) have been input, the character sequence consisting of ten characters is searched for a character sequence that matches with a newly input character sequence "ABCDEF".

If tracing is started at the first matching character, the compression result is as shown in FIG. 6(*b*). More specifically, a character sequence that matches with a character sequence "ABC" (enclosed by a thick frame) is first found, and then, a character sequence that matches with the remaining character sequence "DEF" of the newly input character sequence (enclosed by a thick frame) is found. Thus, the character sequence "ABCDEF" is compressed by being replaced with "<10, 3><7, 3>".

However, if the first matching character is ignored, and tracing is started at the position of the second matching character, the compression result is as shown in FIG. 6(*c*). That is, a character sequence that matches with a character sequence "BCDEF" (enclosed by a thick frame) is found. Thus, the character sequence "ABCDEF" is replaced with "A<7, 5>", and the compressibility is higher than that in the case shown in FIG. 6(*b*).

Whether the first matching character should be ignored or how many matching characters from the first matching character should be ignored depends on the attributes of the data to be compressed. Therefore, in a practical application, it is necessary to perform a plurality of tracings at the same time and select the tracing that yields the longest matching character sequence by discarding the others that yield shorter character sequences.

To this end, according to this embodiment, the byte match detecting mechanism described above with reference to FIGS. 2 to 5 is used, and a plurality of character sequence tracing mechanisms are cascade-connected to the mechanism. The plurality of character sequence tracing mechanisms efficiently perform a character sequence matching search in parallel, with the trace start points being shifted depending on the positions of the character sequence tracing mechanisms in the cascade, and select one of the tracings that yields the longest matching character sequence. In other words, the matching character detecting mechanism that occupies a large area of the apparatus described above with reference to FIGS. 2 to 5 is used, and only a plurality of character sequence tracing mechanisms are additionally provided. In this way, the increase of the hardware resource is minimized, and the character sequence searching function is enhanced without reducing the throughput.

Figures 1, 7:
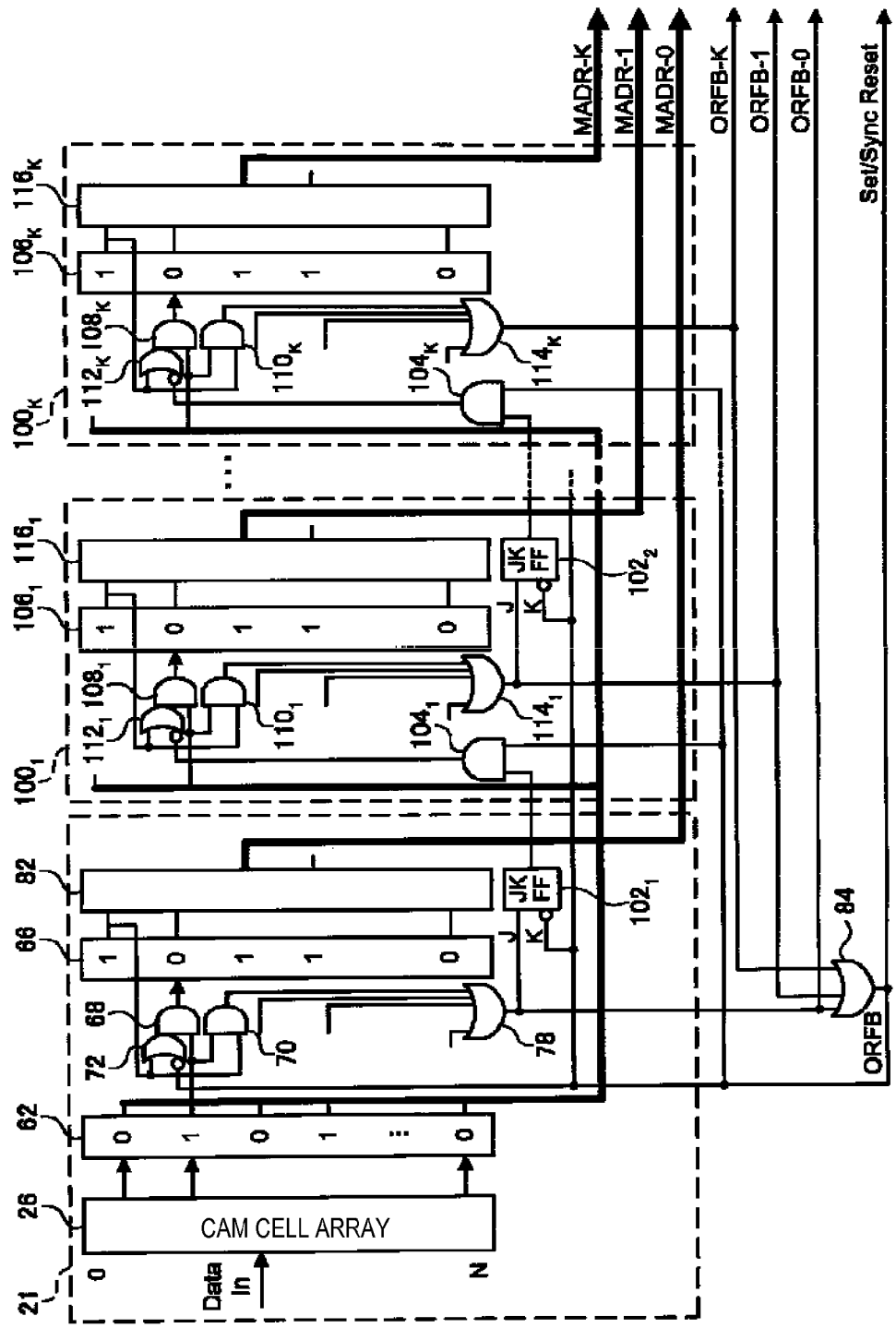
Figures 2, 7:
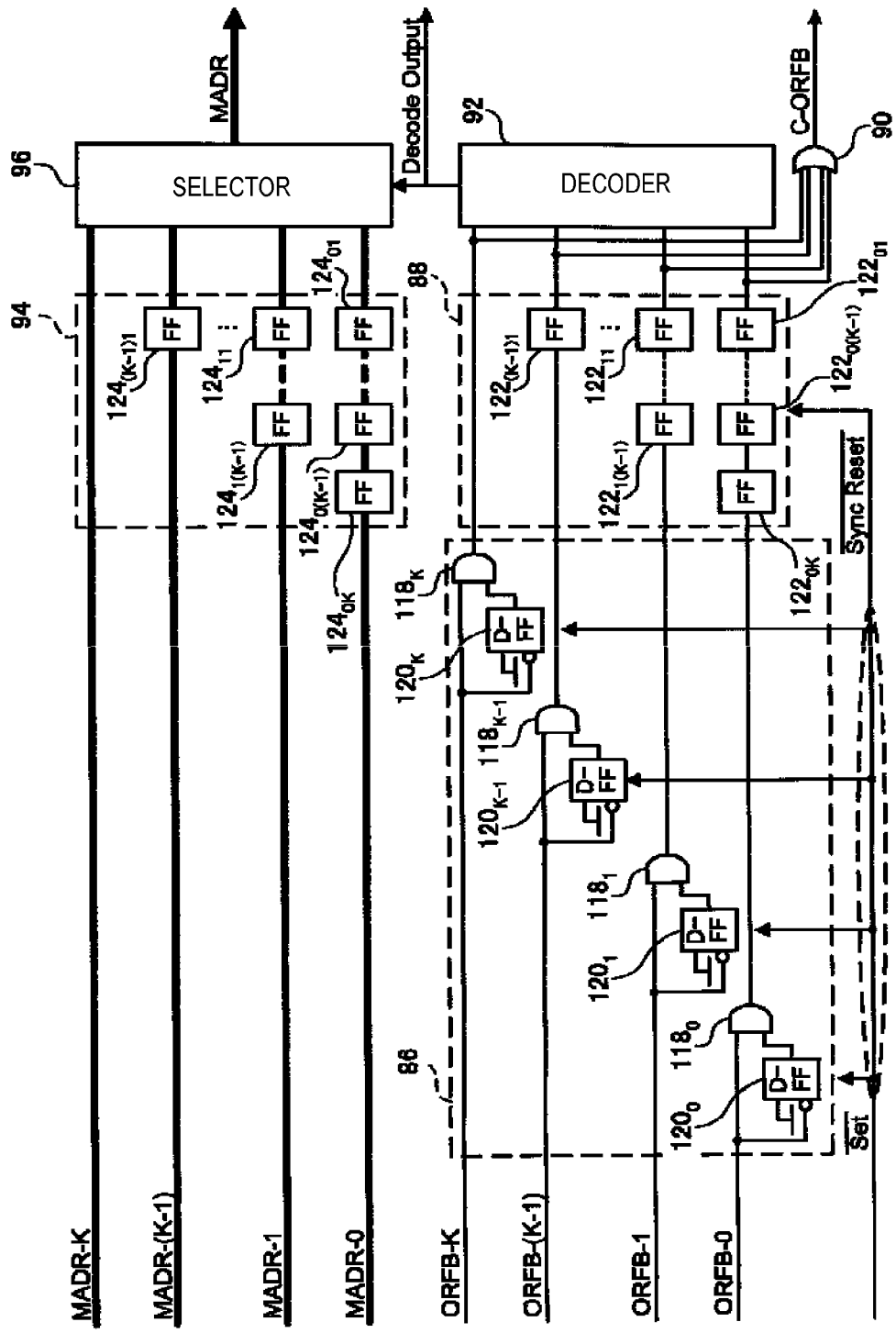

FIGS. 7-1 and 7-2 show an example of the configuration of the iterative data searching apparatus 20 according to this embodiment.

As shown in FIG. 7-1, the iterative data searching apparatus 20 includes the iterative data searching circuit 21 and tracing circuits $100_1$, $100_2$, ..., and $100_K$.

The internal configuration of the iterative data searching circuit 21 is the same as that described above with reference to FIGS. 2 to 4. However, because of the tracing circuits $100_1$, $100_2$, ..., and $100_K$ connected thereto, the configuration of the part of the iterative data searching circuit 21 that receives signals from and outputs signals to external circuits slightly differs from that described above with reference to FIGS. 2 to 5, and only the part will be described below. In the drawings, the latches $62_0$ to $62_N$ in FIG. 4 are collectively shown as the latch 62, and the latches $66_0$ to $66_N$ in FIG. 4 are collectively shown as the latch 66. As in FIG. 4, only the AND circuit $68_K$, the AND circuit $70_1$ and the OR circuit $72_1$ of the AND circuits $68_0$ to $68_N$, the AND circuits $70_0$ to $70_N$ and the OR circuit $72_0$ to $72_N$ are shown. Note that the subscripts are not shown.

As shown in FIG. 7-1, the iterative data searching circuit 21 further includes the OR circuit 78 and a JK flip-flop $102_1$. An output terminal of the OR circuit 78 is connected to one of input terminals of an OR circuit 84, and an output terminal of the OR circuit 84 is connected to one of the two input terminals of the OR circuit 72 via an inverter. The output terminal of the OR circuit 78 is also connected to a J input terminal of the JK flip-flop $102_1$, and the output terminal of the OR circuit 84 is connected to a K input terminal of the JK flip-flop $102_1$ via the inverter.

Although the first priority encoder 74 and the second priority encoder 76 are provided in FIG. 4, only a priority encoder 82 corresponding to the second priority encoder 76 is provided in this example. That is, while the iterative data searching circuit 21 shown in FIG. 4 is formed by the components from the CAM cell array 26 to the first priority encoder 74, the iterative data searching circuit 21 shown in this drawing is formed by the components from the CAM cell array 26 to the priority encoder 82 that corresponds to the second priority encoder 76.

The tracing circuits $100_1$, $100_2$, ..., and $100_K$ can have the same configuration, and therefore, the tracing circuit $100_J$ will be described as a representative (J=1, 2, ..., and K).

The tracing circuit $100_J$ has substantially the same configuration as the iterative data searching circuit 21 excluding the CAM cell array 26 and the latch 62. More specifically, the tracing circuit $100_J$ has latches $106_{J0}$ to $106_{JN}$, AND circuits $108_{J0}$ to $108_{JN}$, AND circuits $110_{J0}$ to $110_{JN}$, OR circuits $112_{J0}$ to $112_{JN}$, an OR circuit $114_J$, and a priority encoder $116_J$, which correspond to the latches $66_0$ to $66_N$, the AND circuits $68_0$ to $68_N$, the AND circuits $70_0$ to $70_N$, the OR circuits $72_0$ to $72_N$, the OR circuit 78 and the priority encoder 82 in the iterative data searching circuit 21, respectively. Note that, for the tracing circuit $100_J$, again, the latches $106_{J0}$ to $106_{JN}$ will be collectively referred to as a latch $106_J$. Of the AND circuits $108_{J0}$ to $108_{JN}$, the AND circuits $110_{J0}$ to $110_{JN}$, and the OR circuits $112_{J0}$ to $112_{JN}$, only the AND circuit $108_{J1}$, the AND circuit $110_{J1}$ and the OR circuit $112_{J1}$ are shown. However, the respective second subscripts (the subscripts indicating the address of the CAM cell row) are not shown.

As shown in FIG. 7-1, the tracing circuit $100_J$ includes the OR circuit $114_J$, the JK flip-flop $102_{J+1}$ and the AND circuit $104_J$. An output terminal of the OR circuit $114_J$ is connected to one of input terminals of the OR circuit 84. The output terminal of the OR circuit $114_J$ is also connected to the J input terminal of the JK flip-flop $102_{J+1}$, and an output terminal of the OR circuit 84 is connected to the K input terminal of the JK flip-flop $102_{J+1}$ via an inverter (except in the case where J=K). The output terminal of the OR circuit 84 is also connected to one of two input terminals of the AND circuit $104_J$, and an output terminal of the JK flip-flop $102_{J-1}$ is connected to the other of the two input terminals of the AND circuit $104_J$.

As shown in FIG. 7-2, the iterative data searching apparatus 20 further includes a timing adjusting circuit group 86, a flip-flop group 88, an OR circuit 90, a decoder 92, a flip-flop group 94 and a selector 96.

The timing adjusting circuit group 86 includes AND circuits $118_0$ to $118_K$ and D flip-flops $120_0$ to $120_K$. One of two input terminals of the AND circuit $118_0$ is connected to the output terminal of the OR circuit 78 in the iterative data searching circuit 21, and the other of the two input terminals of the AND circuit $118_0$ is connected to an output terminal of the D flip-flop $120_0$. A data input terminal of the D flip-flop $120_0$ is grounded, and a clock input terminal of the D flip-flop $120_0$ is connected to the output terminal of the OR circuit 78. One of two input terminals of the AND circuit $118_J$ is connected to the output terminal of the OR circuit $114_J$ in the tracing circuit $100_J$, and the other of the two input terminals of the AND circuit $118_J$ is connected to the output terminal of the D flip-flop $120_J$. The data input terminal of the D flip-flop $120_J$ is grounded, and the clock input terminal of the D flip-flop $120_J$ is connected to the output terminal of the OR circuit $114_J$ (J=1, 2, . . . , and K).

The flip-flop group 88 includes flip-flops $122_{01}$ to $122_{0K}$, $122_{11}$ to $122_{1(K-1)}$, . . . , and $124_{(K-1)1}$. The flip-flops $122_{J1}$ to $122_{J(K-J)}$ form a (K−J)-stage flip-flop, and an input terminal of the flip-flop $122_{J(K-J)}$ is connected to an output terminal of the AND circuit $118_J$, and an output terminal of the flip-flop $122_{J1}$ is connected to input terminals of the OR circuit 90 and the decoder 92 (J=1, 2, . . . , and K−1). Note that an output terminal of the AND circuit $118_K$ is directly connected to input terminals of the OR circuit 90 and the decoder 92.

The flip-flop group 94 includes flip-flops $124_{01}$ to $124_{0K}$, $124_{11}$ to $124_{1(K-1)}$, . . . , and $124_{(K-1)1}$. The flip-flops $124_{01}$ to $124_{0K}$ form a K-stage flip-flop, an input terminal of the flip-flop $124_{0K}$ is connected to the output terminal of the priority encoder 82 in the iterative data searching circuit 21, and an output terminal of the flip-flop $124_{01}$ is connected to an input terminal of the selector 96. The flip-flop $124_{J1}$ to $124_{J(K-J)}$ form a (K−J)-stage flip-flop, an input terminal of the flip-flop $124_{J(K-J)}$ is connected to an output terminal of the priority encoder $116_J$ in the tracing circuit $100_J$, and an output terminal of the flip-flop $124_{J1}$ is connected to an input terminal of the selector 96 (J=1, 2, . . . , and K−1). Note that an output terminal of the priority encoder $116_K$ is directly connected to an input terminal of the selector 96.

In the above description, the part formed by the latch $106_J$, the AND circuit $108_J$, the AND circuit $110_J$, the OR circuit $112_J$, the OR circuit $114_J$ and the priority encoder $116_J$ is an example of a generating circuit, in particular, a J-th expansion generating circuit. The OR circuit 90 is an example of a first output circuit, and the selector 96 is an example of a second output circuit. Although the comparison result controlling circuit 60 and priority encoder 82 and other components are depicted as part of the iterative data searching circuit 21, they function similarly to a tracing circuit. Thus, the iterative data searching circuit 21 can alternatively be defined to exclude the components that function similarly to a tracing circuit, while the excluded components can be defined as an additional tracing circuit.

Figure 8:
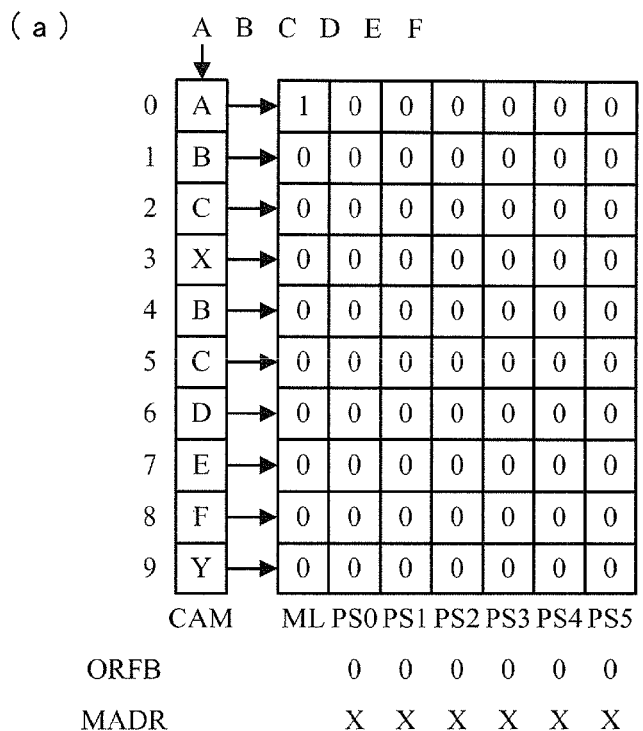
Figure 1:
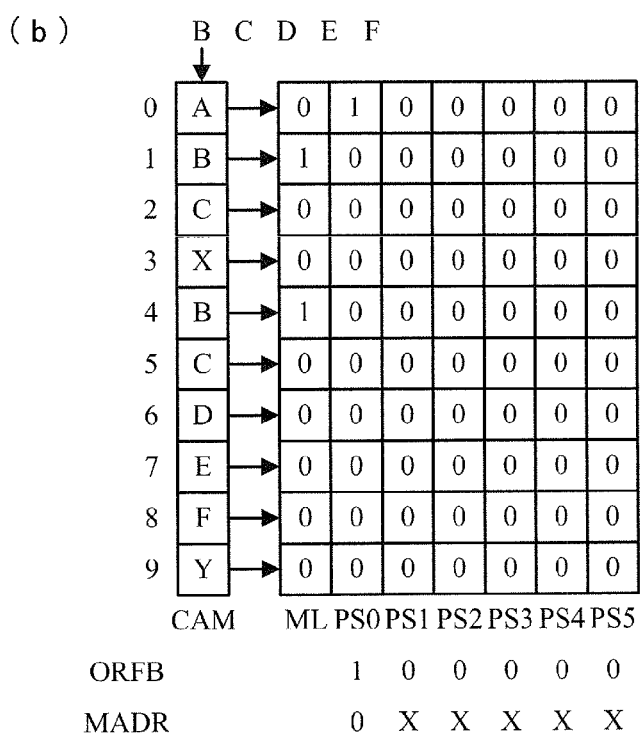
Figure 8:
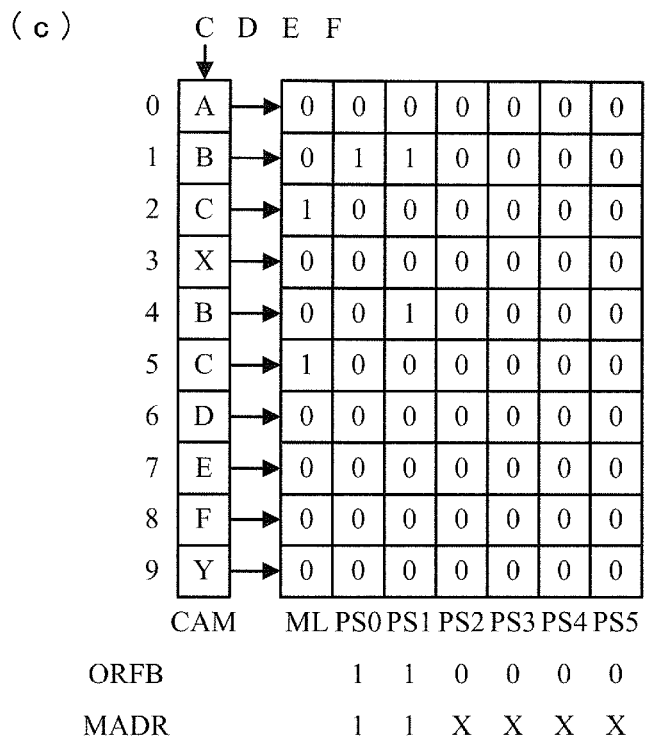
Figure 2:
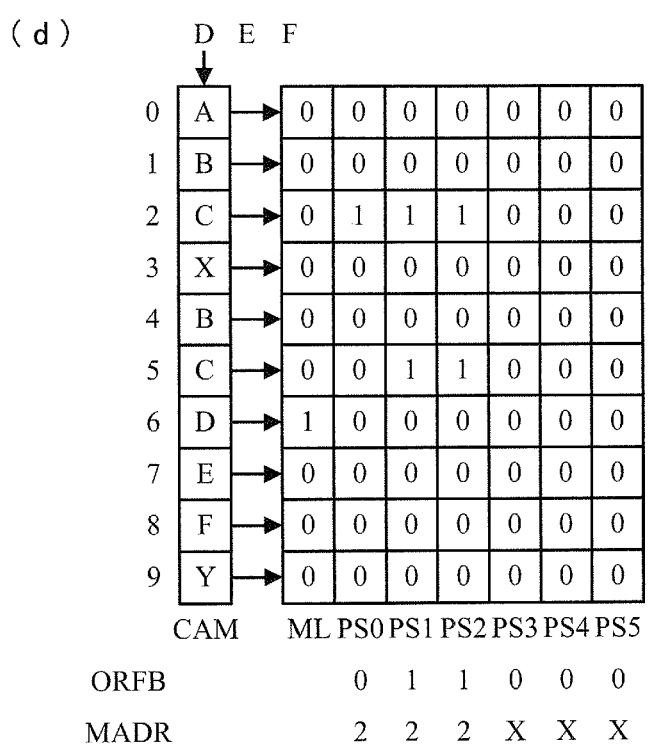
Figure 8:
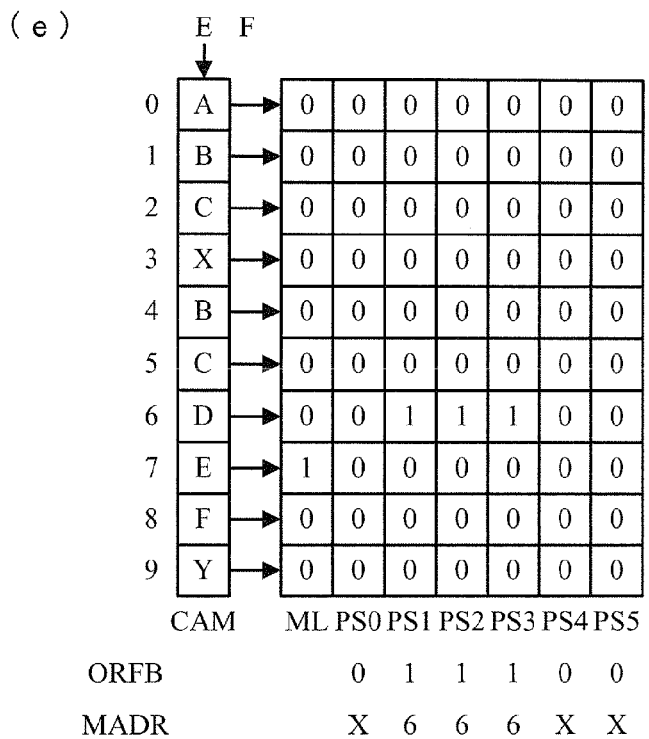
Figure 3:
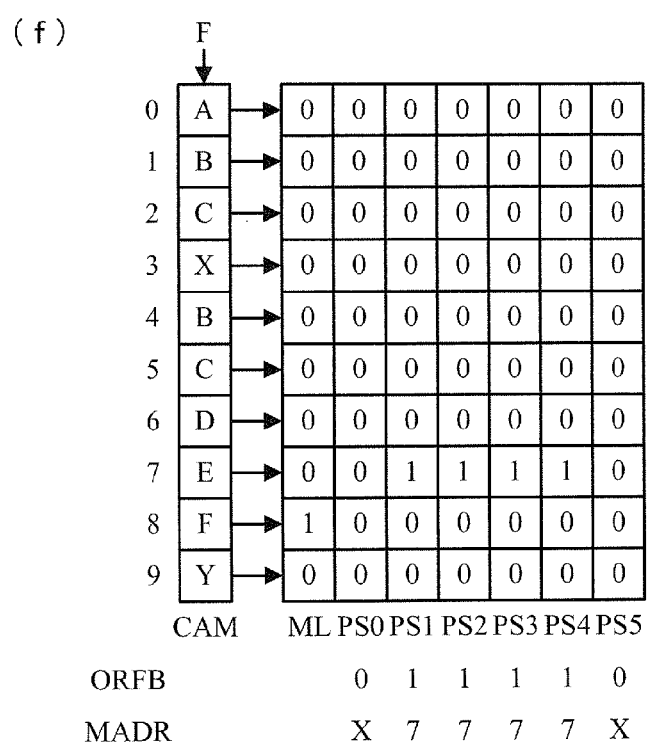

Next, an operation of the iterative data searching apparatus 20 according to this embodiment will be described with reference to FIGS. 8-1 to 8-3. As an example, FIGS. 8-1 to 8-3 show a case where the original data is text data, a character data sequence "ABCXBCDEFY" is previously stored in CAM cell rows of addresses "0" to "9", and character data A, B, C, D, E and F are input in this order as the search data, and it is assumed that the number of tracing circuits 100 is five. The latches $62_0$ to $62_9$ are shown as ML0 to ML9, the latches $66_0$ to $66_9$ are shown as PS00 to PS09, the latches $106_{10}$ to $106_{19}$ are shown as PS10 to PS19, the latches $106_{20}$ to $106_{29}$ are shown as PS20 to PS29, and the latches $106_{50}$ to $106_{59}$ are shown as PS50 to PS59. It is further assumed that if in each of the iterative data searching circuit 21 and the tracing circuits $100_1$, $100_2$, . . . , and $100_J$, a plurality of latches PS holds "1", the priority encoders 82 and $116_1$, $116_2$, . . . , and $116_K$ selects and outputs the lowest address.

As shown in FIG. 8-1(a), when character data "A" is first input as the search data, the comparison result is "match" in the CAM cell row of an address "0", so that the level held in the latch ML0 is HIGH level.

At this point in time, the levels held in the latches PS00 to PS09 are LOW level, so that all the signals output from the AND circuits $70_0$ to $70_9$ are at LOW level, and a feedback signal ORFB-0 output from the OR circuit 78 is also at LOW level.

Since the levels held in the latches PS10 to PS19, . . . , and PS50 to PS59 are LOW level, all the signals output from the AND circuits $110_{10}$ to $110_{19}$, . . . , and $110_{50}$ to $110_{59}$ are at LOW level, and feedback signals ORFB-1, . . . , and ORFB-5 output from the OR circuits $114_1$, . . . , and $114_5$ are also at LOW level.

Since the feedback signals ORFB-0, ORFB-1, . . . , and ORFB-5 are at LOW level as described above, the signal output from the OR circuit 84 is at LOW level, so that all the outputs of the OR circuits $72_0$ to $72_9$ are at HIGH level, and the levels of the signals output from the latches ML0 to ML9 are held in the latches PS00 to PS09 without change. Thus, only the latch PS00 of the latches PS00 to PS09 holds HIGH level, so that the priority encoder 82 outputs an address "0" as an match address MADR-0 (see FIG. 8-1(b)).

In addition, the signal at LOW level output from the OR circuit 78 is input to the J input terminal of the JK flip-flop $102_1$, and the signal at HIGH level inverted from the signal at LOW level output from the OR circuit 84 is input to the K input terminal of the JK flip-flop $102_1$, so that the level held in the JK flip-flop $102_1$ is LOW level.

As shown in FIG. 8-1(b), when character data "B" is input as the next search data, the comparison result is "match" in the CAM cell rows of addresses "1" and "4", so that the levels held in the latches ML1 and ML4 are HIGH level.

At this point in time, the level held in the latch PS00 is HIGH level, so that the signal output from the AND circuit $70_1$ is at HIGH level, and the feedback signal ORFB-0 output from the OR circuit 78 is also at HIGH level.

Since the levels held in the latches PS10 to PS19, . . . , and PS50 to PS59 are LOW level, all the signals output from the AND circuits $110_{10}$ to $110_{19}$, . . . , and $110_{50}$ to $110_{59}$ are at LOW level, and the feedback signals ORFB-1, . . . , and ORFB-5 output from the OR circuits $114_1$, . . . , and $114_5$ are also at LOW level.

Since the feedback signal ORFB-0 is at HIGH level as described above, the signal output from the OR circuit 84 is also at HIGH level, so that logical products of the levels of the signals output from the latches ML0 to ML9 and the signals output from the latches PS in the respective preceding stages are held in the latches PS00 to PS09. Thus, only the latch PS1 of the latches PS00 to PS09 holds HIGH level, so that the priority encoder 82 outputs an address "1" as the match address MADR-0 (see the PS0 field in FIG. 8-2(c)).

The level having been held in the JK flip-flop $102_1$ is LOW level, and the signal output from the AND circuit $104_1$ is also at LOW level, so that all the outputs of the OR circuits $112_{10}$ to $112_{19}$ are at HIGH level, and the levels of the signals output from the latches ML0 to ML9 are held in the latches PS10 to PS19 without change. Thus, the latches PS11 and PS14 of the latches PS10 to PS19 hold HIGH level, so that the priority encoder $116_1$ outputs an address "1" as the match address MADR-1 (see the PS1 field in FIG. 8-2(c)).

In addition, the signal at HIGH level output from the OR circuit 78 is input to the J input terminal of the JK flip-flop $102_1$, and the signal at LOW level inverted from the signal at HIGH level output from the OR circuit 84 is input to the K input terminal of the JK flip-flop $102_1$, so that the level held in the JK flip-flop $102_1$ is HIGH level.

The signal at LOW level output from the OR circuit $114_1$ is input to the J input terminal of the JK flip-flop $102_2$, and the signal at HIGH level inverted from the signal at LOW level output from the OR circuit 84 is input to the K input terminal of the JK flip-flop $102_2$, so that the level held in the JK flip-flop $102_2$ is LOW level.

As shown in FIG. 8-2(c), when character data "C" is input as the next search data, the comparison result is "match" in the CAM cell rows of addresses "2" and "5", so that the levels held in the latches ML2 and ML5 are HIGH level.

At this point in time, the level held in the latch PS01 is HIGH level, so that the signal output from the AND circuit $70_1$ is at HIGH level, and the feedback signal ORFB-0 output from the OR circuit 78 is also at HIGH level.

Since the levels held in the latches PS11 and PS14 are HIGH level, the signals output from the AND circuits $110_{11}$ and $110_{14}$ are at HIGH level, and the feedback signal ORFB-1 output from the OR circuit $114_1$ is also at HIGH level.

Since the levels held in the latches PS20 to PS29, . . . , and PS50 to PS59 are LOW level, all the signals output from the AND circuits $110_{20}$ to $110_{29}$, . . . , and $110_{50}$ to $110_{59}$ are at LOW level, and the feedback signals ORFB-2, . . . , and ORFB-5 output from the OR circuits $114_2$, . . . , and $114_5$ are also at LOW level.

Since the feedback signals ORFB-0 and ORFB-1 are at HIGH level as described above, the signal output from the OR circuit 84 is also at HIGH level, so that logical products of the levels of the signals output from the latches ML0 to ML9 and the signal output from the latch PS0 in the preceding stage are held in the latches PS00 to PS09. Thus, only the latch PS02 of the latches PS00 to PS09 holds HIGH level, so that the priority encoder 82 outputs an address "2" as the match address MADR-0 (see the PS0 field in FIG. 8-2(d)).

The level having been held in the JK flip-flop $102_1$ is HIGH level, the signal output from the OR circuit 84 is at HIGH level, and the signal output from the AND circuit $104_1$ is also at HIGH level, so that logical products of the levels of the signals output from the latches ML0 to ML9 and the signal output from the latch PS1 in the preceding stage are held in the latches PS10 to PS19. Thus, the latches PS12 and PS15 of the latches PS10 to PS19 hold HIGH level, so that the priority encoder $116_1$ outputs an address "2" as the match address MADR-1 (see the PS1 field in FIG. 8-2(d)).

The level having been held in the JK flip-flop $102_2$ is LOW level, and the signal output from the AND circuit $104_2$ is also at LOW level, so that all the outputs of the OR circuits $112_{20}$ to $112_{29}$ are at HIGH level, and the levels of the signals output from the latches ML0 to ML9 are held in the latches PS10 to PS19 without change. Thus, the latches PS22 and PS25 of the latches PS20 to PS29 hold HIGH level, so that the priority encoder $116_2$ outputs an address "2" as a match address MADR-2 (see the PS2 field in FIG. 8-2(d)).

In addition, the signal at HIGH level output from the OR circuit 78 is input to the J input terminal of the JK flip-flop $102_1$, and the signal at LOW level inverted from the signal at HIGH level output from the OR circuit 84 is input to the K input terminal of the JK flip-flop $102_1$, so that the level held in the JK flip-flop $102_1$ is HIGH level.

The signal at HIGH level output from the OR circuit $114_1$ is input to the J input terminal of the JK flip-flop $102_2$, and the signal at LOW level inverted from the signal at HIGH level output from the OR circuit 84 is input to the K input terminal of the JK flip-flop $102_2$, so that the level held in the JK flip-flop $102_2$ is HIGH level.

The signal at LOW level output from the OR circuit $114_2$ is input to the J input terminal of the JK flip-flop $102_3$, and the signal at LOW level inverted from the signal at HIGH level output from the OR circuit 84 is input to the K input terminal of the JK flip-flop $102_3$, so that the level held in the JK flip-flop $102_3$ is LOW level.

As shown in FIG. 8-2(d), when character data "D" is input as the next search data, the comparison result is "match" in the CAM cell row of an address "6", so that the level held in the latch ML6 is HIGH level.

At this point in time, the level held in the latch PS05 in the preceding stage of the latch ML6 is LOW level, and the level held in the latch PS02 is HIGH level although the level held in the latch ML3 in the subsequent stage is LOW level, so that all the signals output from the AND circuits $70_0$ to $70_9$ are at LOW level, and the feedback signal ORFB-0 output from the OR circuit 78 is also at LOW level.

Since the levels held in the latches PS12, PS15, PS22 and PS25 are HIGH level, all the signals output from the AND circuits $110_{10}$ to $110_{19}$ and $110_{20}$ to $110_{29}$ are at HIGH level, and the feedback signals ORFB-1 and ORFB-2 output from the OR circuits $114_1$ and $114_2$ are also at HIGH level.

Since the levels held in the latches PS30 to PS39, . . . , and PS50 to PS59 are LOW level, all the signals output from the AND circuits $110_{30}$ to $110_{39}$, . . . , and $110_{50}$ to $110_{59}$ are at LOW level, and the feedback signals ORFB-3, . . . , and ORFB-5 output from the OR circuits $114_3$, . . . , and $114_5$ are also at LOW level.

Since the feedback signals ORFB-1 and ORFB-2 are at HIGH level as described above, the signal output from the OR circuit 84 is also at HIGH level, so that logical products of the levels of the signals output from the latches ML0 to ML9 and the signal output from the latch PS0 in the preceding stage are held in the latches PS00 to PS09 (see the PS0 field in FIG. 8-3(e)). That is, the character sequence no longer matches with the search data at this point, so that the levels held in the latches PS00 to PS09 are LOW level.

The levels having been held in the JK flip-flops $102_1$ and $102_2$ are HIGH level, the signal output from the OR circuit 84 is at HIGH level, and the signals output from the AND circuits $104_1$ and $104_2$ are also at HIGH level, so that logical products of the levels of the signals output from the latches ML0 to ML9 and the signals output from the latches PS1 and PS2 in the preceding stages are held in the latches PS10 to PS19 and PS20 to PS29. Thus, the latches PS16 and PS26 of the latches PS10 to PS19 and PS20 to PS29 hold HIGH level, so that the priority encoders $116_1$ and $116_2$ output an address "6" as the match addresses MADR-1 and MADR-2 (see the PS1 field and the PS2 field in FIG. 8-3(e)).

The level having been held in the JK flip-flop $102_3$ is LOW level, and the signal output from the AND circuit $104_3$ is also at LOW level, so that all the outputs of the OR circuits $112_{30}$ to $112_{39}$ are at HIGH level, and the levels of the signals output from the latches ML0 to ML9 are held in the latches PS30 to PS39 without change. Thus, the latch PS36 of the latches PS30 to PS39 hold HIGH level, so that the priority encoder $116_3$ outputs an address "6" as a match address MADR-3 (see the PS3 field in FIG. 8-3(e)).

In addition, the signal at LOW level output from the OR circuit 78 is input to the J input terminal of the JK flip-flop $102_1$, and the signal at LOW level inverted from the signal at HIGH level output from the OR circuit 84 is input to the K input terminal of the JK flip-flop $102_1$, so that the level held in the JK flip-flop $102_1$ is HIGH level.

The signals at HIGH level output from the OR circuits $114_1$ and $114_2$ are input to the J input terminals of the JK flip-flops $102_2$ and $102_3$, and the signal at LOW level inverted from the signal at HIGH level output from the OR circuit 84 is input to the K input terminals of the JK flip-flops $102_2$ and $102_3$, so that the levels held in the JK flip-flops $102_2$ and $102_3$ are HIGH level.

The signal at LOW level output from the OR circuit $114_3$ is input to the J input terminal of the JK flip-flop $102_4$, and the signal at LOW level inverted from the signal at HIGH level output from the OR circuit 84 is input to the K input terminal of the JK flip-flop $102_4$, so that the level held in the JK flip-flop $102_4$ is LOW level.

As shown in FIG. 8-3(e), when character data "E" is input as the next search data, the comparison result is "match" in the CAM cell row of an address "7", so that the level held in the latch ML6 is HIGH level.

At this point in time, the levels held in the latches PS00 to PS09 are LOW level, so that all the signals output from the AND circuits $70_0$ to $70_9$ are at LOW level, and the feedback signal ORFB-0 output from the OR circuit 78 is also at LOW level.

Since the levels held in the latches PS16, PS26 and PS36 are HIGH level, all the signals output from the AND circuits $110_{10}$ to $110_{19}$, $110_{20}$ to $110_{29}$ and $110_{30}$ to $110_{39}$ are at HIGH level, and the feedback signals ORFB-1, ORFB-2 and ORFB-3 output from the OR circuits $114_1$, $114_2$ and $114_3$ are also at HIGH level.

Since the levels held in the latches PS40 to PS49 and PS50 to PS59 are LOW level, all the signals output from the AND circuits $110_{40}$ to $110_{49}$ and $110_{50}$ to $110_{59}$ are at LOW level, and the feedback signals ORFB-4 and ORFB-5 output from the OR circuits $114_4$ and $114_5$ are also at LOW level.

Since the feedback signals ORFB-1, ORFB-2 and ORFB-3 are at HIGH level as described above, the signal output from the OR circuit 84 is also at HIGH level, so that logical products of the levels of the signals output from the latches ML0 to ML9 and the signal output from the latch PS0 in the preceding stage are held in the latches PS00 to PS09 (see the PS0 field in FIG. 8-3(f)).

The levels having been held in the JK flip-flops $102_1$, $102_2$ and $102_3$ are HIGH level, the signal output from the OR circuit 84 is at HIGH level, and the signals output from the AND circuits $104_1$, $104_2$ and $104_3$ are also at HIGH level, so that logical products of the levels of the signals output from the latches ML0 to ML9 and the signals output from the latches PS1, PS2 and PS3 in the preceding stages are held in the latches PS10 to PS19, PS20 to PS29 and PS30 to PS39. Thus, the latches PS17, PS27 and PS37 of the latches PS10 to PS19, PS20 to PS29 and PS30 to PS39 hold HIGH level, so that the priority encoders $116_1$, $116_2$ and $116_3$ output an address "7" as the match addresses MADR-1, MADR-2 and MADR-3 (see the PS1 field, the PS2 field and the PS3 field in FIG. 8-3(f)).

The level having been held in the JK flip-flop $102_4$ is LOW level, and the signal output from the AND circuit $104_4$ is also at LOW level, so that all the outputs of the OR circuits $112_{40}$ to $112_{49}$ are at HIGH level, and the levels of the signals output from the latches ML0 to ML9 are held in the latches PS40 to PS49 without change. Thus, the latch PS47 of the latches PS40 to PS49 hold HIGH level, so that the priority encoder $116_4$ outputs an address "7" as a match address MADR-4 (see the PS4 field in FIG. 8-3(f)).

In the operation described above, the feedback signals ORFB-0 to ORFB-K (K=5 in the example described above) output each time character data is input are output to the decoder 92 via the AND circuits $118_0$ to $118_K$. In this embodiment, if the feedback signal ORFB from the OR circuit 84 is set at LOW level, the D flip-flops $120_0$ to $120_K$ are set at HIGH level, and the feedback signals ORFB-0 to ORFB-K can pass through the AND circuits $118_0$ to $118_K$. On the other hand, if the levels of the feedback signals ORFB-0 to ORFB-K are once set at HIGH level and then set at LOW level, the levels of the signals input to the clock input terminals of the D flip-flops $120_0$ to $120_K$ change from LOW level to HIGH level, and the feedback signals ORFB-0 to ORFB-K cannot pass through the AND circuits $118_0$ to $118_K$.

The match addresses MADR-0 to MADR-5 that are also output each time character data is input are output to the selector 96.

However, according to this embodiment, the (K−J)-stage flip-flop 122 is provided prior to the decoder 92 on the path of the feedback signal ORFB-J, and the (K−J)-stage flip-flop 124 is provided prior to the selector 96 on the path of the match address MADR-J (J=1, 2, . . . , K−1), whereas no flip-flop is provided prior to the decoder 92 and the selector 96 on the paths of the feedback signal ORFB-K and the match address MADR-K. As a result, the feedback signals ORFB-0 to ORFB-5 and the match addresses MADR-0 to MADR-5 do not arrive at the decoder 92 and the selector 96 at a timing synchronized with the time of input of the character data, which is used as a reference in the operation described above, but arrive at the decoder 92 and the selector 96 at a timing shifted by the number of stages of the flip-flop.

Next, an operation of the iterative data searching apparatus 20 with respect to the timing when the decoder 92 and the selector 96 receive the signals will be described. Although not shown in FIGS. 8-1 to 8-3, it will be assumed in the following description that the character data "F" shown in FIG. 8-3(f) is the last character data in the character sequence that matches with the stored data. That is, when the character data subsequent to the character data "F" is input, the feedback signals ORFB-0 to ORFB-5 are set at LOW level. The decoder 92 indicates to the selector 96 of the number of any feedback signal ORFB set at HIGH level of the feedback signals ORFB-0 to ORFB-5, and the selector 96 selects the match address MADR for the smallest number from among the match addresses MADR for the numbers of which the selector 96 is indicated by the decoder 92.

First, the point in time when the decoder 92 receives the feedback signal ORFB-0 output at the point in time shown in FIG. 8-1(b) from the flip-flop $122_{01}$ will be considered. At this point in time, the decoder 92 receives the feedback signal ORFB-1 output at the point in time shown in FIG. 8-2(c) from the flip-flop $122_{11}$, the feedback signal ORFB-2 output at the point in time shown in FIG. 8-2(d) from the flip-flop $122_{21}$, the feedback signal ORFB-3 output at the point in time shown in FIG. 8-3(e) from the flip-flop $122_{31}$, the feedback signal ORFB-4 output at the point in time shown in FIG. 8-3(f) from the flip-flop $122_{41}$, and the feedback signal ORFB-5 (at LOW level) output after the point in time shown in FIG. 8-3(f) from the priority encoder $116_5$. In this case, the feedback signals ORFB-0 to ORFB-4 are at HIGH level, so that a consolidated ORFB (consolidated feedback signal, abbreviated as C-ORFB hereinafter) output from the OR circuit 90 to the data compression controller 22 is at HIGH level. The decoder 92 informs the selector 96 that the feedback signals ORFB-0 to ORFB-4 are at HIGH level, and the selector 96 selects the match address MADR-0 and outputs an address "0" to the data compression controller 22.

Then, the decoder 92 receives the feedback signal ORFB-0 output at the point in time shown in FIG. 8-2(c) from the flip-flop $122_{01}$, the feedback signal ORFB-1 output at the point in time shown in FIG. 8-2(d) from the flip-flop $122_{11}$, the feedback signal ORFB-2 output at the point in time shown in FIG. 8-3(e) from the flip-flop $122_{21}$, the feedback signal ORFB-3 output at the point in time shown in FIG. 8-3(f) from the flip-flop $122_{31}$, and the feedback signals ORFB-4 and ORFB-5 (both at LOW level) output after the point in time shown in FIG. 8-3(f) from the flip-flop $122_{41}$ and the priority encoder $116_5$, respectively. In this case, the feedback signals ORFB-0 to ORFB-3 are at HIGH level, so that the consolidated feedback signal C-ORFB output from the OR circuit 90 to the data compression controller 22 is at HIGH level. The decoder 92 informs the selector 96 that the feedback signals ORFB-0 to ORFB-3 are at HIGH level, and the selector 96 selects the match address MADR-0 and outputs an address "1" to the data compression controller 22.

Then, the decoder 92 receives the feedback signal ORFB-0 output at the point in time shown in FIG. 8-2(d) from the flip-flop $122_{01}$, the feedback signal ORFB-1 output at the point in time shown in FIG. 8-3(e) from the flip-flop $122_{11}$, the feedback signal ORFB-2 output at the point in time shown in FIG. 8-3(f) from the flip-flop $122_{21}$, and the feedback signals ORFB-3 to ORFB-5 (all at LOW level) output after the point in time shown in FIG. 8-3(f) from the flip-flop $122_{31}$, the flip-flop $122_{41}$ and the priority encoder $116_5$, respectively. In this case, the feedback signals ORFB-1 and ORFB-2 are at HIGH level, so that the consolidated feedback signal C-ORFB output from the OR circuit 90 to the data compression controller 22 is at HIGH level. The decoder 92 informs the selector 96 that the feedback signals ORFB-1 and ORFB-2 are at HIGH level, and the selector 96 selects the match address MADR-1 and outputs an address "6" to the data compression controller 22. In the example shown in FIGS. 8-1 to 8-3, in the case where tracing starts at the character data "A", the character sequence no longer matches with the stored data at this point in time, so that the decoder 92 does not inform the selector 96 of the feedback signal ORFB-0 so that the selector 96 does not select the feedback signal ORFB-0.

Then, the decoder 92 receives the feedback signal ORFB-0 output at the point in time shown in FIG. 8-3(e) from the flip-flop $122_{01}$, the feedback signal ORFB-1 output at the point in time shown in FIG. 8-3(f) from the flip-flop $122_{11}$, and the feedback signals ORFB-2 to ORFB-5 (all at LOW level) output after the point in time shown in FIG. 8-3(f) from the flip-flop $122_{21}$, the flip-flop $122_{31}$, the flip-flop $122_{41}$ and the priority encoder $116_5$, respectively. In this case, the feedback signal ORFB-1 is at HIGH level, so that the consolidated feedback signal C-ORFB output from the OR circuit 90 to the data compression controller 22 is at HIGH level. The decoder 92 informs the selector 96 that the feedback signal ORFB-1 is at HIGH level, and the selector 96 selects the match address MADR-1 and outputs an address "7" to the data compression controller 22.

Then, the decoder 92 receives the feedback signal ORFB-0 output at the point in time shown in FIG. 8-3(f) from the flip-flop $122_{01}$, and the feedback signals ORFB-1 to ORFB-5 (all at LOW level) output after the point in time shown in FIG. 8-3(f) from the flip-flop $122_{11}$, the flip-flop $122_{21}$, the flip-flop $122_{31}$, the flip-flop $122_{41}$ and the priority encoder $116_5$, respectively. In this case, the feedback signals ORFB-1 to ORFB-5 are all at LOW level, so that the consolidated feedback signal C-ORFB output from the OR circuit 90 to the data compression controller 22 is at LOW level.

Therefore, the data compression controller 22 uses, as the match address, the address "7" received from the selector 96 immediately before the consolidated feedback signal C-ORFB is set at LOW level.

Next, an operation of the data compression controller according to this embodiment will be described.

Figure 9:
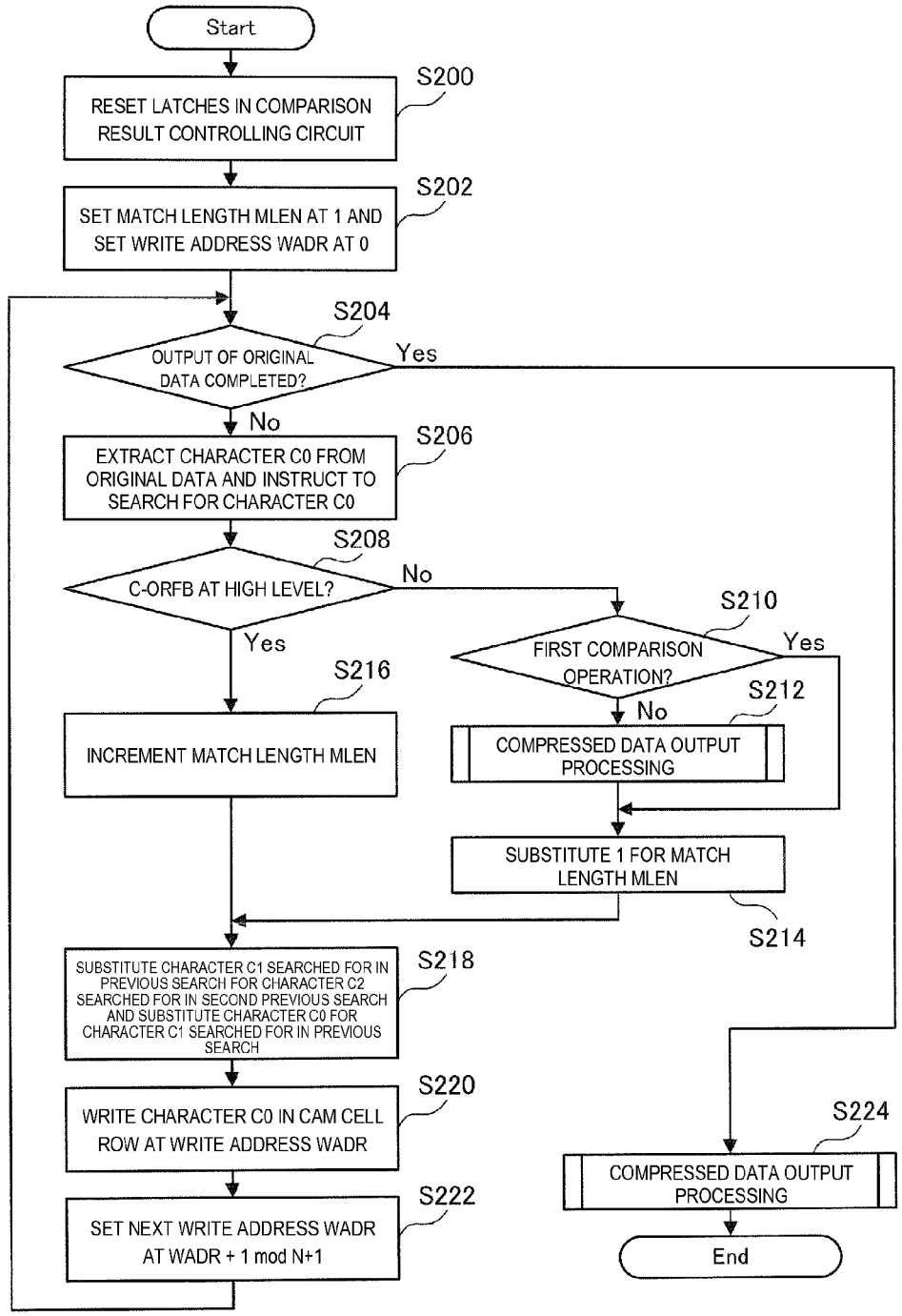
FIG. 9 is a flowchart showing an example of an operation of a data compression controller according to the embodiment of the present inventive subject matter.

FIG. 9 is a flowchart showing a process performed in the data compression controller 22. This process is performed when data to be compressed (original data) is transferred to the data compression controller 22 via the bus 18, and the data compression controller 22 is instructed by the CPU 12 to compress the original data.

The data compression controller 22 first resets the latches $62_0$ to $62_N$ and the latches $66_0$ to $66_N$ in the comparison result controlling circuit 60 in the iterative data searching apparatus 20 (Step 200). Then, initialization is performed to set a match length MLEN at "1" and the write address WADR at "0" (Step 202). Then, it is determined whether output of the original data to the iterative data searching apparatus 20 is completed or not (Step 204). If the determination result is negative, data on a character C0 corresponding to the leading one character is extracted from the original data as search data, and the data is output to the iterative data searching apparatus 20 along with the search instruction SEARCH and the write address WADR (Step 206). In response to this, the iterative data searching apparatus 20 performs the search operation described above.

Then, the data compression controller 22 determines whether the character sequence match signal C-ORFB output from the iterative data searching apparatus 20 is set at HIGH level or not (Step 208). In this case, since the latches 62 and the latches 66 have been reset in preceding Step 200, and therefore, the character sequence match signal C-ORFB is maintained at LOW level, the determination result is negative, and the process proceeds to Step 210. Then, the data compression controller 22 determines whether the current comparison operation is the first comparison operation on predetermined original data or not (Step 210). If the determination result is positive, a processing of outputting compressed data in Step 212 is bypassed, and the process proceeds to Step 214. As with the feedback signal ORFB described above, the character sequence match signal C-ORFB is not set at HIGH level unless two or more successive characters match with the stored data, and therefore, if a succession of comparison results "not match" occurs, the character searched for in the previous search is output as compressed data as described later. Thus, there is no data to be output as the compressed data at this point in time, and therefore, Step 212 is not performed.

Then, the data compression controller 22 substitutes "1" for the match length MLEN (Step 214), and the process proceeds to Step 218. Then, the data compression controller 22 substitutes data on the character C1 searched for in the previous search for the character C2 searched for in the second previous search and substitutes data on the character C0 searched for in the current search for the character C1 searched for in the previous search (Step 218), and writes the data on the character C0 in the CAM cell row corresponding to the current write address WADR (0 in the first comparison operation) (Step 220). In practice, the write processing is performed by the address decoder 52 asserting (enabling) the word line of the CAM cell row corresponding to the write address WADR. Furthermore, the data compression controller 22 increments the write address WADR by 1 to provide the next write address WADR (that is, the character data is written in ascending order of the addresses of the CAM cell rows), divides the write address WADR by the size N+1 of the CAM cell array 26, and sets the remainder (Step 222).

Once data are written in all the CAM cell rows in this way, data is written in the CAM cell row of an address "0". Thus, the CAM cell array 26 is used as a so-called ring buffer, and an overflow of the CAM cell array 26 or the like does not occur.

After the processing in Step 222 is performed, the process returns to Step 204. If the result of the determination in Step 204 is negative, the process in Step 206 and the following steps are performed again. In Step 206, data on the character C0 subsequent to the character C1 searched for in the previous search is extracted from the original data as the search data and output to the iterative data searching apparatus 20 along with the search instruction SEARCH and the write address WADR. Then, if the result of the determination in Step 208 is negative, the process proceeds to Step 210. If the result of the determination in Step 210 is negative, the compressed data output processing in Step 212 is performed.

Figure 10:
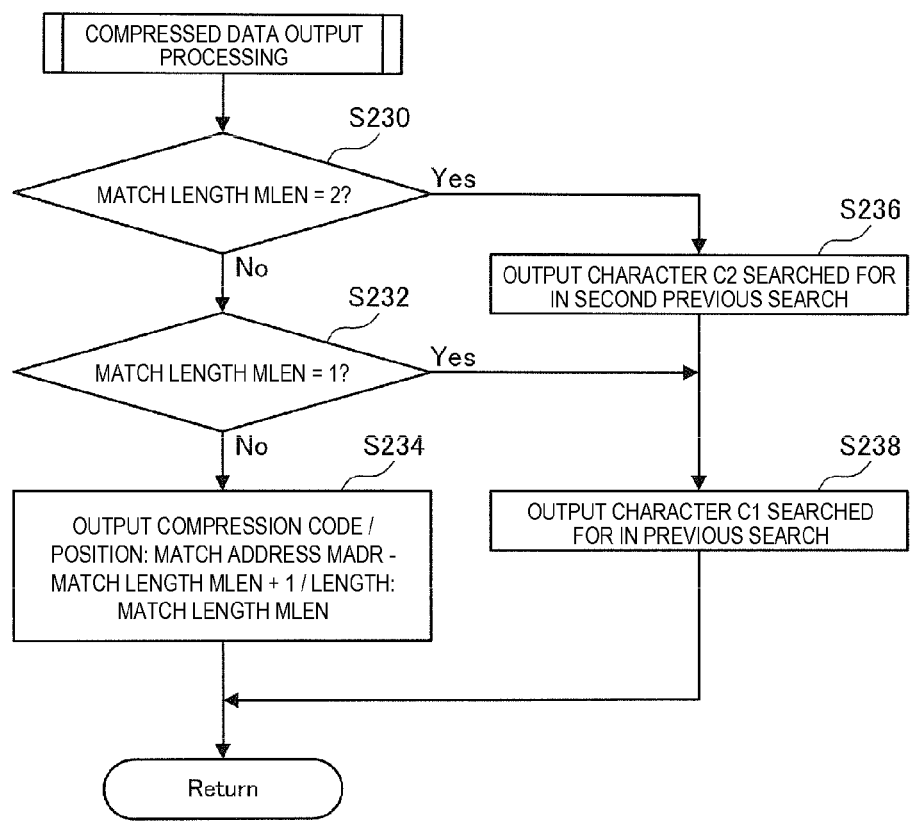
FIG. 10 is a flowchart showing details of a compressed data output processing in the flowchart shown in FIG. 9.

In this compressed data output processing, as shown in FIG. 10, the data compression controller 22 determines whether the match length MLEN is 2 or not (Step 230). If the result of the previous comparison is "match", but the result of the second previous comparison is not "match", the determination result is positive, data on the character C2 searched for in the second previous search is output as the compressed data (Step 236), data on the character C1 searched for in the previous search is then output (Step 238), and then the process proceeds to Step 214 in the flowchart shown in FIG. 9.

If the result of the determination in Step 230 is negative, the data compression controller 22 determines whether the match length MLEN is 1 or not (Step 232). If the result of the previous comparison is not "match", the determination result is positive, data on the character C1 searched for in the previous search is output as the compressed data (Step 238), and then the process proceeds to Step 214 in the flowchart shown in FIG. 9.

In the flowchart shown in FIG. 9, if the result of the determination in Step 208 is positive, the match length MLEN is incremented (Step 216), and then, the process proceeds to Step 218. Therefore, no compressed data is output while the character sequence match signal C-ORFB is at HIGH level.

If the character sequence match signal C-ORFB having been at HIGH level in the previous comparison operation is changed to LOW level, and the result of the determination in Step 210 is negative, it means that the end of an iterative character sequence having a length of two or more characters is detected, so that the compressed data output processing is performed in Step 212. In this case, if both the results of the previous comparison and the second previous comparison are "match", the match length MLEN is incremented to 3 or greater in Step 216 described above, so that the results of the determinations in Steps 230 and 232 are both negative, and the process proceeds to Step 234.

Then, the data compression controller 22 determines a compression code for compressing the iterative character sequence. According to this embodiment, a compression code comprising a first code that represents a pointer that indicates the position of a character sequence that matches with the iterative character sequence and a second code that represents the length of the iterative character sequence is used, the difference between the match address MADR and the match length MLEN plus 1 (MADR−MLEN+1) is set as the first code and output, and the match length MLEN is set as the second code and output (Step 234). As a result, the length of the compressed data output from the data compression controller 22 is shorter than that of the original data.

When the compression code is output, in order to distinguish between the compression code and the character data when the compressed character sequence is decompressed, the data compression controller 22 also inserts a code representing a break point between the character data and the compression code. In this way, each time an iterative character sequence is found, Step 234 is performed, the found iterative character sequence is converted into a compression code, and the compression code is output, thereby removing the redundancy of the original data and compressing the original data into compressed data.

The process described above is repeated, and when the position in the original data at which data on the character C is extracted reaches the end of the original data, the result of the determination in Step 204 is positive, and the data compression controller 22 performs the compressed data output processing again (Step 224). In this case, if the value of the match length MLEN is equal to or greater than 3, the compression code is output in Step 234. However, if the value of the match length MLEN is 2, the data on the character C2 searched for in the second previous search is output as the compressed data in Step 236, the data on the character C1 searched for in the previous search is output as the compressed data in Step 238, and the process ends. If the value of the match length MLEN is 1, the data on the character C1 searched for in the previous search is output as the compressed data in Step 238, and the process ends.

Although the pointer that indicates the position of a character sequence that matches with the iterative character sequence is used as the first code of the compression code in this operation example, the distance between the position of a character sequence that matches with the iterative character sequence and the position of the iterative character sequence can also be used, as in the example described above. In this case, the data compression controller 22 can recognize the circuit that has continuously output the feedback signal at HIGH level for the longest time among the iterative data searching circuit 21 and the tracing circuits $100_1$, $100_2$, ..., and $100_K$ based on a decode output signal (see FIG. 7-2) from the iterative data searching apparatus 20 and use, as the first code, a value obtained by subtracting the position of the character sequence that matches with the iterative character sequence from the position of the character at which tracing is started in the circuit.

An embodiment of the present inventive subject matter has been described above.

As described above, according to this embodiment, to the iterative data searching circuit 21 that detects character data that matches with input character data from the CAM cell array 26 and determines whether the input character data matches with the detected character data as a character sequence, the plurality of tracing circuits 100 that make the matching determination for character sequences starting at different search start points shifted in steps of one character is connected. As a result, a longer character sequence can be efficiently detected from a target to be searched containing a plurality of character sequences having different lengths containing an identical part, and the compressibility can be improved.

Although it is assumed in this embodiment that a character sequence is compressed by replacing a part of the character sequence with information on the position and the length of another part of the character sequence, it may be assumed that a search start point for searching a part of a character sequence is determined based on another part of the character sequence. In that case, it is enough to identify the circuit for which the number of successive generations of the feedback signal ORFB at HIGH level is the greatest of the iterative data searching circuit 21 and the tracing circuits $100_1, 100_2, \ldots,$ and $100_K$, so that it is not always necessary to determine the consolidated feedback signal C-ORFB by taking a logical sum of the feedback signals ORFB or to count the number of successive outputs of the consolidated feedback signal C-ORFB.

Although a specific start point previously determined for the circuit for which the number of successive generations of the feedback signal ORFB at HIGH level is the greatest is designated as the search start point in this embodiment, the present inventive subject matter is not limited to this implementation. For example, tracing may be terminated at the point in time when the number of successive generations of the feedback signal ORFB at HIGH level exceeds a threshold, any circuit that is generating the feedback signal at HIGH level at that point in time may be selected, and the specific start point previously determined for the selected circuit may be designated as the search start point. More generally, the specific start point previously determined for a circuit that satisfies a predetermined condition in terms of the number of successive generations of the feedback signal ORFB at HIGH level may be designated as the search start point.

Furthermore, although the specific start points of the iterative data searching circuit 21 and the tracing circuits $100_1, 100_2, \ldots,$ and $100_K$ are shifted in steps of one character in this embodiment, the present inventive subject matter is not limited to this implementation. It is essential only that the circuits have different specific start points, and the specific start points can be shifted in steps of any number of characters.

Although an embodiment of the present inventive subject matter has been described above, the technical scope of the present inventive subject matter is not limited to the embodiment described above. It is obvious to those skilled in the art that various modifications can be made and various alternatives can be used without departing from the spirit and scope of the present inventive subject matter.

The invention claimed is:

1. An apparatus comprising:
    a plurality of tracing circuits,
        wherein a first tracing circuit of the plurality of tracing circuits is configured to,
            receive a first indication that a first stored data element of a plurality of stored data elements matches a first search data element, wherein the first stored data element is associated with a first address;
            store the first indication that the first stored data element of the plurality of stored data elements matches the first search data element; and
        wherein a second tracing circuit of the plurality of tracing circuits is configured to,
            receive a second indication that a second stored data element of the plurality of stored data elements matches a second search data element, wherein the second stored data element of the plurality of stored data elements is associated with a second address;
            store the second indication that the second stored data element of the plurality of stored data elements matches the second search data element; and
            output an indication of the second address associated with the second stored data element to indicate a match with the second stored data element;
        wherein the first tracing circuit of the plurality of tracing circuits is further configured to:
            receive a third indication that a third stored data element of the plurality of stored data elements matches the first search data element, wherein the third stored data element of the plurality of stored data elements is associated with a third address, wherein the third indication is received in parallel with the first indication;
            store the third indication that the third stored data element of the plurality of stored data elements matches the first search data element; and
            output an indication of either the first address or third address to indicate a match with the first search data element, wherein a lowest address between the first address or third address are output.

2. The apparatus of claim 1, wherein the plurality of stored data elements is ordered, wherein one of the second stored data element of the plurality of stored data elements is ordered sequentially after the first stored data element of the plurality of stored data elements and the first stored data element of the plurality of stored data elements is ordered sequentially after the second stored data element of the plurality of stored data elements.

3. The apparatus of claim 1, wherein each stored data element of the plurality of stored data elements corresponds to a row of content addressable memory cells in an array of content addressable memory cells.

4. The apparatus of claim 1, wherein at least one indication that a stored data element matches a search data element is stored in a latch.

5. The apparatus of claim 1 further comprising:
    a decoder coupled with the plurality of tracing circuits, the decoder configured to,
        receive one or more indications that a plurality of sequential stored data elements match a plurality of sequential search data elements; and
        output an indication of an address line of a plurality of address lines;
    a selector coupled with the plurality of tracing circuits and the decoder, the selector configured to,
        receive the indication of the address line of the plurality of address lines;
        select an address line input based, at least in part, on the indication of the address line of the plurality of address lines; and
        output an address corresponding to the selected address line input.

6. The apparatus of claim 5 further comprising:
    a controller coupled with the plurality of tracing circuits and the selector, the controller configured to,
        receive the one or more indications that the plurality of sequential stored data elements match the plurality of sequential search data elements;
        receive the address corresponding to the selected address line input;
        determine a count of sequential stored data elements in the plurality of sequential stored data elements; and output an indication of the address corresponding to the selected address line input and the count of sequential stored data elements in the plurality of sequential stored data elements.

7. The apparatus of claim 6, wherein the controller configured to output the indication of the address corresponding to the selected address line input and the count of sequential stored data elements in the plurality of sequential stored data elements is configured to:

generate compressed data by replacing a plurality of original data elements corresponding to the plurality of sequential search data elements with the indication of the address corresponding to the selected address line input and the count of sequential stored data elements in the plurality of sequential stored data elements; and output the compressed data.

8. The apparatus of claim 7, wherein the indication of the address corresponding to the selected address line input comprises one of an address corresponding to a row of content addressable memory cells in an array of content addressable memory cells, an address corresponding to a location in memory, and an offset.

* * * * *